(12) United States Patent
Janssens et al.

(10) Patent No.: US 8,842,705 B2
(45) Date of Patent: Sep. 23, 2014

(54) LIGHT EMITTING SYSTEMS

(71) Applicant: Barco N. V., Kortrijk (BE)

(72) Inventors: Peter Eric Rita Janssens, Ghent (BE); Bart Van Den Bossche, Kuurne (BE); Glenn Jacques Suzanne Van Den Bergh, Sint-Amandsberg (BE); Wouter Theo Maria D'Oosterlinck, Eeklo (BE)

(73) Assignee: Barco N.V., Kortrijk (BE)

( * ) Notice: Subject to any disclaimer, the term of this patent is extended or adjusted under 35 U.S.C. 154(b) by 66 days.

(21) Appl. No.: 13/657,101

(22) Filed: Oct. 22, 2012

(65) Prior Publication Data

US 2013/0100974 A1 Apr. 25, 2013

Related U.S. Application Data

(60) Provisional application No. 61/549,871, filed on Oct. 21, 2011.

(30) Foreign Application Priority Data

Oct. 21, 2011 (GB) .................................. 1118214.4

(51) Int. Cl.
*H01S 3/04* (2006.01)
*G02B 19/00* (2006.01)
*G02B 27/09* (2006.01)
*G03B 21/20* (2006.01)
*H01S 5/40* (2006.01)
*H01S 5/022* (2006.01)

(52) U.S. Cl.
CPC ........ *G02B 27/0961* (2013.01); *G02B 19/0028* (2013.01); *G03B 21/2013* (2013.01); *H01S 5/02212* (2013.01); *G03B 21/2033* (2013.01); *H01S 5/4012* (2013.01); *G02B 19/0057* (2013.01)
USPC ................................. 372/35; 372/34; 372/36

(58) Field of Classification Search
CPC ......... H01S 5/20; H01S 5/024; H01S 5/0242; H01S 5/40; H01S 5/401233
USPC ................................................. 372/34, 35, 36
See application file for complete search history.

(56) References Cited

U.S. PATENT DOCUMENTS

| | | | |
|---|---|---|---|
| 4,978,197 A | 12/1990 | Horikawa | |
| 6,240,116 B1 | 5/2001 | Lang et al. | |

(Continued)

FOREIGN PATENT DOCUMENTS

| | | |
|---|---|---|
| EP | 1 253 685 A1 | 10/2002 |
| EP | 1298939 | 4/2003 |

(Continued)

OTHER PUBLICATIONS

Supplemental European Search Report for corresponding European Patent Application No. EP 12 18 6391 mailed Nov. 16, 2012.

(Continued)

*Primary Examiner* — Armando Rodriguez
(74) *Attorney, Agent, or Firm* — Renner, Otto, Boisselle & Sklar LLP

(57) ABSTRACT

A laser diode grid element comprising laser diodes arranged along a corresponding substantially flat surface; and a collimator for each laser diode for generating collimated light beams substantially perpendicular on the respective substantially flat surface. The laser diodes are comprised in standard packages including a base plate serving as cooling surface of the laser diode, a metal housing arranged on the base plate to protect the laser diode, and at least two driving pins which extend from the laser diode through the base plate and which are used for driving the laser diode within the package. The laser diode grid element includes a heat sink arranged in contact with the base plates, and the at least two driving pins of each laser diode extend at least partially through the heat sink. Also provided are light emitting systems comprising such grid elements, and an optical component for use in such system.

19 Claims, 18 Drawing Sheets

(56) References Cited

U.S. PATENT DOCUMENTS

| | | | |
|---|---|---|---|
| 6,377,410 B1 | 4/2002 | Wang et al. | |
| 2006/0274434 A1 | 12/2006 | Mino et al. | |
| 2008/0217643 A1 | 9/2008 | Lin et al. | |
| 2009/0086169 A1 | 4/2009 | Nakamura | |
| 2009/0122272 A1 | 5/2009 | Silverstein et al. | |
| 2011/0188010 A1 | 8/2011 | Lin et al. | |

FOREIGN PATENT DOCUMENTS

| | | | |
|---|---|---|---|
| EP | 2 317 614 | | 5/2011 |
| JP | 2007/201285 | | 1/2006 |
| JP | 2010/263070 | | 5/2009 |
| JP | 2317614 | * | 4/2011 |
| WO | 2010/146904 | | 12/2010 |
| WO | 2011/033979 | | 3/2011 |

OTHER PUBLICATIONS

Great Britain Search Report for corresponding Great Britain Patent Application No. 1118214.4 mailed Mar. 14, 2012.

* cited by examiner

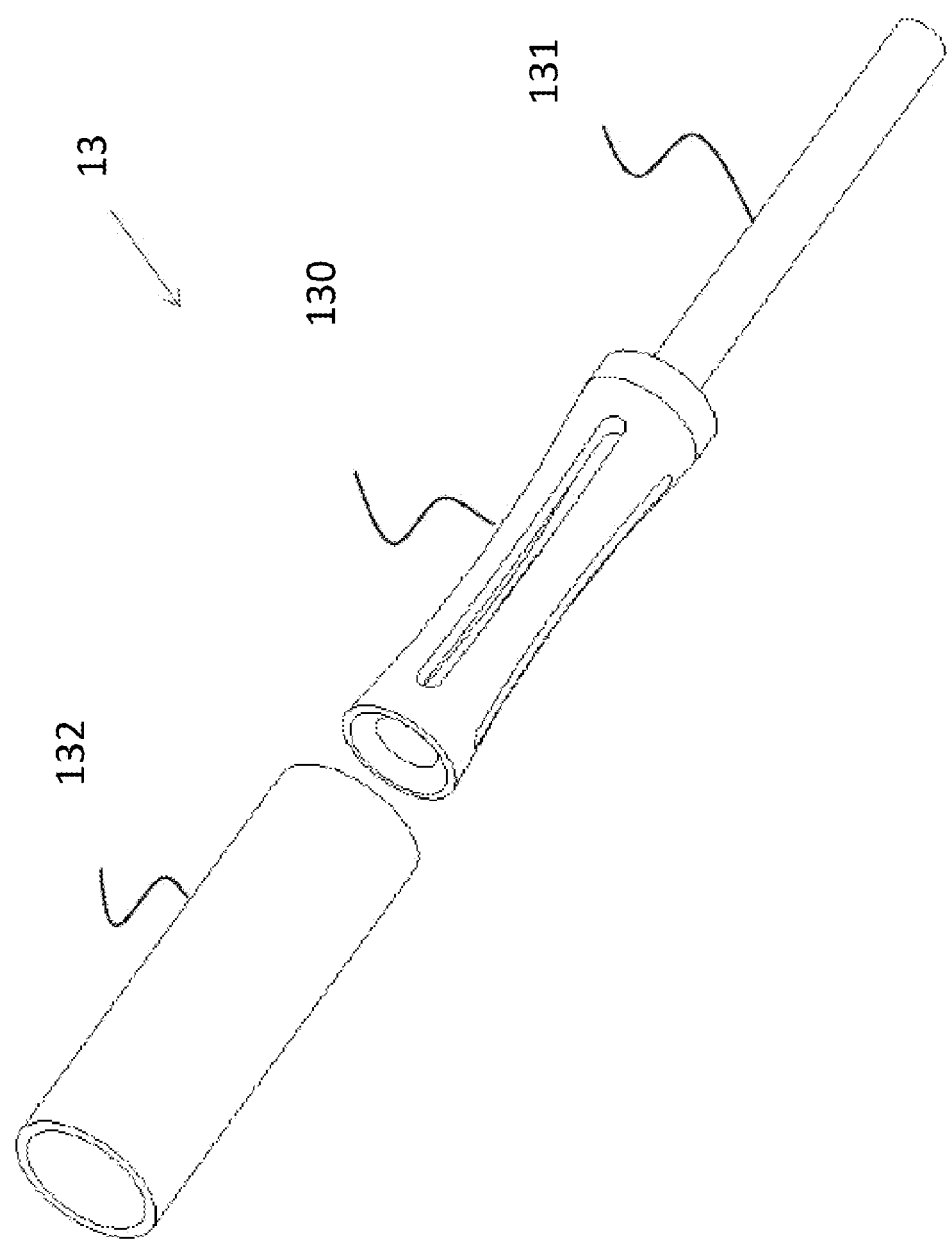

LIGHT EMITTING SYSTEMS

This application claims priority of United Kingdom Patent Application No. 1118214.4 filed Oct. 21, 2012 and U.S. Provisional Application No. 61/549,871 filed Oct. 21, 2011, these applications being fully incorporated herewith by reference.

The present invention relates to light emitting systems, more particularly, to light emitting systems comprising at least one grid of semiconductor laser diodes.

BACKGROUND TO THE INVENTION

Diode lasers are semiconductor lasers. A plurality of these lasers is typically produced by wafer-level processing, after which the wafer is diced into the individual lasers. In edge-emitting type of lasers the light propagates in the plane of the semiconductor wafer. The intersection of the gain medium of the laser, perpendicular to the propagation of the light, is typically rectangular shaped. The height is typically of the order of 1 μm. The width of the gain medium is determined by the application of the lasers: for single-spatial mode lasers, the gain medium has to be very narrow, while for high power applications the gain medium is made much wider (e.g. 20 times the height of the gain medium). In the case of a wide gain medium there can be several spatial modes present in the widest direction of the laser gain medium. For high-brightness laser projection based on a 2D imager, an excellent beam quality per laser is not required, and as such diodes with a relatively wide gain medium and increased power per emitter are preferred.

The direction of the width of the gain medium is typically called slow axis, while the direction of the height of the gain medium is typically called fast axis.

The shape of the diode's gain medium has an important influence on the beam properties of the diode laser. First of all the beam profile for high power diode lasers will often have an irregular shape in the slow axis, due to the presence of the multiple spatial modes: several maxima in the light intensity of the far field of the laser can be observed in the direction of slow axis. This is caused by the fact that due to the width of the gain medium, the light is less confined in space along the slow axis.

In addition, diffraction will cause a difference in the beam divergence. In the fast axis the beam will be more divergent than in the direction of the slow axis. The different divergence is caused by diffraction: a smaller aperture will result in larger diffraction angles. As such the widest direction of the laser's gain medium corresponds to the narrowest angular distribution. The divergence of the lasers can be 25° in one direction and 50° degrees in the other direction. Lasers are typically combined with collimation lenses to change the diverging bundle into a parallel bundle. The difference in divergence between fast and slow axis then translates into a larger beam waist in the fast axis then the slow axis after collimation.

This asymmetry is an important parameter for the optical design of high-brightness laser projectors, where the étendue of the system has to be managed accurately and any étendue loss has to be avoided, or at least minimized. To achieve the maximum brightness the maximum amount of individual laser diodes has to be combined within the available étendue of the system.

After dicing, the lasers are packaged, for example into a TO9 can, or other type of typically standardised package (e.g. also smaller size TO-can type packages exist: e.g. TO38, which is only 3.8 mm in diameter). FIG. 1 shows a picture of the TO9 package. The package is composed of a metal plate, which serves as the cooling surface for the laser. On this cooling plate a metal housing is mounted to protect the laser. The light is emitted in a direction perpendicular to the cooling plate (upwards in the left pane of FIG. 1) and leaves the TO9 can through a window in the housing. There are typically 2 or 3 pins on the back side of the cooling plate, which are used for driving the lasers. The problem with these pins is that they will penetrate the cooling surface on which the lasers are to be positioned: the heat dissipated in the laser is transferred to the cooling plate, which is the bottom of the package. Then this heat has to be removed by a cooling system. As such the cooling plate of the lasers will have to be mounted in close contact to a heat sink. This heat sink can be cooled by air or by a liquid cooling system. Cooling lasers is not trivial, as the lasers should typically be operated at temperatures around room temperature. In addition it is preferred to tightly control the temperature of the lasers, as temperature variations result in variations in the emitted optical power and in the wavelength of the lasers. Therefore the lasers are designed for and operated at a well-defined temperature; e.g. 25° C.

The length of the pins on the TO-9 can is also limited. If a direct connection with the driver printed circuit board is to be made, this significantly limits the thickness of the heat sink.

SUMMARY OF THE INVENTION

In order to combine the lasers into one powerful beam, laser packages could be positioned as close as possible to each other. This could e.g. be achieved by putting all the TO-cans as close to each other as possible in a wafer-like mounting. However, this has some important limitations.

The beam properties are not symmetrical: the divergence of the laser beam is larger along the fast axis than along the slow axis. As a result, after collimation the beam is wider along the fast axis than along the slow axis. Even if the space between adjacent beams is minimized along the fast axis, significant space between adjacent beams will exist along the slow axis. This results in an étendue loss as a part of the étendue space is not used. In other words the étendue of the combined beam is significantly larger then the sum of the étendue of the individual beams.

In order to control the temperature of a densely spaced array of high power laser diodes a liquid cooling system is preferred. Therefore cooling liquid channels in the heat sink need to be provided, but this heat sink at the same time is penetrated by the pins for the electrical driving of the lasers. Putting the lasers as close as possible limits the dimensions of the liquid cooling channels. The heat sink has also to be thin enough, such that the pins of the laser packages still can reach the driver electronics which is mounted on the back side of the heat sink. As such also the thickness of the heat sink is limited and it becomes extremely difficult to provide sufficient cooling.

It is an object of the present invention to provide a light emitting system comprising a plurality of laser diodes, and wherein a maximum number of laser beams generated from said plurality of laser diodes are combined into a predetermined output aperture, with a minimal étendue, which solve at least some of the above mentioned problems.

It is a further object of the present invention to provide a light emitting system wherein a maximum number of laser beams generated from laser diodes, typically having an asymmetric beam profile, are combined into a predetermined aperture with a minimal étendue.

It is a further object of the present invention to provide a light emitting system comprising a plurality of laser diodes, which combines the beams generated by the laser diodes with a minimal étendue, and which provides sufficient cooling as well as a driving means for the laser diodes.

According to a first aspect of the present invention, a laser diode grid element is disclosed, comprising a plurality of laser diodes adapted for generating a corresponding plurality of laser beams and the plurality of laser diodes being arranged along a corresponding substantially flat surface;

a collimation means for each the laser diodes, adapted for generating a collimated light beam from a corresponding laser beam, the collimated light beams being substantially perpendicular on the respective substantially flat surface;

wherein the laser diodes are comprised in standard packages, the standard packages comprising a base plate (typically a metal base plate) serving as cooling surface of the laser diode, a housing (typically metal housing) arranged on the base plate to protect the laser diode, and at least two driving pins which extend from the laser diode through the base plate and which are used for driving the laser diode within the package; and wherein the laser diode grid element comprises a heat sink, the heat sink being arranged in contact with the base plates, and wherein the at least two driving pins of each laser diode extend at least partially through the heat sink.

For the purpose of the present description, the term "grid" and "grid element" are used. "Grid" refers to the geometric arrangement as such, while "grid element" refers to the device comprising the laser diodes arranged according on it's surface, preferably according to a grid structure. The skilled person will understand when one of the terms would also imply the other.

Embodiments of the present invention provide the advantage that a plurality of standard laser packages can be arranged along a substantially flat surface with minimal distances (for instance smaller then 2 mm, smaller than 1 mm, preferably smaller than 0.5 mm) between nearest laser diode packages (e.g. between two adjacent standard laser diode packages) in at least 1 direction, while providing means for efficient cooling and driving of the lasers. Wherein further the collimated laser beams of the plurality of diode lasers are combined in an output aperture of predetermined shape with minimal étendue An arrangement of standard packages below a certain density threshold is difficult to achieve because of heating of the packages and insufficient cooling, e.g. at room temperature, or insufficient temperature regulation possibilities. Often lasers need to operate at a predetermined temperature in order to be optimally efficient or in order to provide the required frequency, intensity, stability and lifetime or other characteristics.

The collimation means can comprise a lens. The lenses can be spherical or aspherical lenses. Spherical lenses may suffer from spherical aberrations. Aspherical lenses can resolve these and provide a better approximation of an ideal lens, such that a better collimation may be achieved. The lenses can be arranged in alignment with said plurality of laser diodes. The set of all lenses can be adapted for adjusting the laser beams generated from the standard laser diode packages into collimated laser beams which are substantially parallel, or parallel. Each lens can be adapted for converting a laser beam generated by a standard laser diode package into a collimated laser beam, the direction of which is orthogonal on the substantially flat surface.

The driving pins are typically metal driving pins, as they provide the laser diodes with electrical current for driving and powering them.

The laser diodes can be single emitter laser diodes.

According to preferred embodiments, the heat sink comprises a liquid cooling heat exchanger comprising channels for liquid cooling, and the channels and the driving pins of the laser diodes are offset between each other.

The liquid cooling heat exchanger can further comprise a liquid circulation driving means as for instance a pump for circulating a cooling liquid (e.g. distilled water, possibly further comprising additives, or other cooling liquids known to the skilled person) in the channels. By having the driving pins and liquid cooling channels being offset, e.g. not overlapping when projected onto the substantially flat surface, the laser diode packages can be arranged in an optimal arrangement with respect to cooling. The cooling channels and plurality of laser diode packages are preferably arranged relative to each other such that an optimal temperature regulation or cooling of the laser diode packages can be achieved.

It is an advantage that the heat from the plurality of laser diode packages can be extracted, such that the temperature of the laser diode packages during use can be controlled, by means of the heat sink. The heat sink and the laser diode packages are produced independently. Moreover the dimensions of the heat sink, and the dimensions and density and arrangement of cooling channels can be varied based on one of the type, shape, density, amount, driving power etc. of laser diodes used.

The heat sink preferably comprise through holes or vias at locations corresponding with the positions of the laser diode packages, especially their driving pins. These vias can be of constant cross-section. They can for instance be of circular or elliptical cross-section. Other cross-sections are not excluded as will be recognized by the skilled person. The vias may comprise an "8" (eight)-type shaped, which comprises e.g. two circular (or e.g. elliptical) sub-vias, each sub-via corresponding with a respective driving pin.

The vias may have an electrically isolated sidewall. The sidewall of the vias can therefore be provided with a liner made of an electrically insulating material (for instance PVC or rubber, but other electrically insulating materials known to the skilled person may be used). Alternatively the driving pins may be electrically isolated from the sidewalls of the vias by one, two or more electrical isolation tubes arranged around the respective driving pins. The properties of these tubes can be the same as those of the liner. It is also possible to combine liners and tubes as described above.

According to preferred embodiments, the driving pins are electrically connected to a printed circuit board provided at a side of the heat sink opposed to the laser diode side.

By directly connecting the lasers with the printed circuit board which is arranged just below the heat sink, a very compact arrangement can be achieved, which is important when the available space/volume for designing a light emitting system is limited. This also provides the advantage that heat from the driving circuits present on the printed circuit board can be extracted towards the heat sink. A further advantage is that the length of the electrical connection between the laser diode and the laser driving circuits present on the printed circuit board can be minimized. This is especially important to enable high frequency modulation of the laser diodes.

According to preferred embodiments, the driving pins are connected to the printed circuit board by means of an extension connector, the extension connector at least partially extending into the heat sink.

The use of an extension connector provides the advantage that when the optimal thickness of the heat sink (or combined thickness of heat sink and thermally conducting (and preferably electrically isolating) pad when present, (see below), more generally the distance between the bottom of the base plates and the top of the printed circuit board, when assembled, would be larger than the length of the driving pins (e.g. standard laser diode package), the interconnect through the heat sink can still be achieved. The extension connector can comprise extension pins which can be connected with the driving pins of the diode laser package on a first end, and which can be connected to the printed circuit board at a second end. Therefore the extension connecter may comprise a clamping section, e.g. near its center part, which can guarantee a good and stabile contact between the driving pins of the laser diode package and the leads of the extension connector. The use of an extension connector also provides the advantage that the electrical connection between laser diode package and printed circuit board is tolerant to small alignment errors, as the extension connector, or the combination of driving pins and extension connector can be flexible. The movement of the electrical contact comprising the driving pins and the extension connector can be limited by the dimension, e.g. cross-section of the vias. According to preferred embodiments, each driving pin of a laser diode package can be extended by means of a separate extension connector. Alternatively, a single extension connector can be used for extending two, three or more, e.g. all, driving pins of a respective laser diode package.

According to preferred embodiments, the laser diode grid element further comprises a thermal conduction means in between the printed circuit board and the heat sink. This provides the advantage that heat from the printed circuit board can be more efficiently extracted by, or guided towards, the heat sink.

According to preferred embodiments, the collimation means comprises a plurality of lenses provided in a single molded array of lenses. This can simplify the assembly of a laser diode grid element. The lenses within the single molded array are positioned at predetermined relative positions. Therefor a single alignment step is necessary to align the lenses (collimation means) with the plurality of laser diodes.

According to preferred embodiments, the laser diode grid element further comprises a positioning plate, the positioning plate being adapted for keeping the laser diodes at predetermined locations and being arranged in between the collimation means and the plurality of laser diodes.

The positioning plate may therefore comprise openings, each of the openings being adapted for receiving the housings of the laser diode packages. These opening can for instance have a circular cross-section for cylindrical housings, whereby the diameter of the opening is only slightly larger than the diameter of the cylindrical housing. According to preferred embodiment the positioning plate is thus arranged at a level above the level of the base plates of the laser diode packages, i.e. the bottom surface of the positioning plate is above the upper surface of the base plate. Preferably one or more springs are located in between those surfaces pushing the laser diode package against the flat surface of the heat sink. According to alternative embodiments, the positioning plate may comprise recesses corresponding with the base plates of the laser diodes, the recesses (e.g. circular recesses forming a ring structure with limited thickness, around the via) being adapted for accommodating or receiving the base plate. Preferably the base plate can be accommodated in the recess in such a way that a spring is positioned between the upper surface of the baseplate and the bottom (surface) of the recess, while the lower surface of the baseplate is flush with the bottom surface of the positioning plate, i.e. these surfaces are laying in the same plane.

Preferably the positioning plate is made out of a thermally conducting material, such that heat transfer from the laser diode packages to the heat sink can be improved; an extra heat transfer pad, through the positioning plate can be present. This is especially the case when the base plates of the laser diodes is flush with the bottom of the positioning plate, when being received in recesses within said baseplate as described above.

The use of a positioning plate provides the advantage that the standard laser diodes can be arranged easily at predetermined positions. The standard packages have predetermined dimensions, especially their baseplates. For a predetermined type of laser diode package, suitably dimensioned openings (and recesses, if present) can be provided at predetermined positions in the base plate. The base plates of the laser diodes can then be positioned by mechanical references on either the heat-sink or on the positioning plate.

According to preferred embodiments, a thermally conductive paste can be applied/present in between the base plates of the laser diodes and the heat sink.

According to preferred embodiments, the laser diode grid element further comprises an alignment means for aligning the collimation means relative to the heat sink or relative to the positioning plate.

In the case that the collimation means comprises a molded array of collimating lenses, the alignment means is preferably adapted for aligning and preferably also fixing the molded array of collimating lenses relative to the heat sink and therefore relative to the laser packages (as the laser packages are at predetermined positions with respect to the heat sink). The alignment means may comprise a plurality of individual adjustment means, for instance a first set of adjustment means adapted for controlling the distance and parallelism between the array of collimating lenses and the substantially flat surface along which the laser diodes are mounted, and a second set of adjustment means adapted for aligning the optical axes of the collimating lenses with the center of the laser beams emitted from the laser diodes. The alignment means may further comprise fixation means to lock the collimation means in position after adjustment.

According to alternative embodiments, the laser diode grid element does not comprise said alignment means, as alignment can also be performed with an external alignment means, which itself does not cause a permanent fixation of the molded array of collimating lenses with the heat sink. Therefore a system comprising a laser diode grid element according to embodiments of the present invention but without "internal" alignment means, and an alignment means external to the laser diode grid element is disclosed. After the alignment step the collimating lenses can for instance be glued in place and the external alignment means can be removed.

A single alignment can therefor be enough to align the collimating means for all laser diode packages.

According to preferred embodiments, the laser diodes are arranged according to a grid structure on the substantially flat surface, the grid structure having a vertical inter-diode spacing and a horizontal inter-diode spacing orthogonal on the vertical inter-diode spacing. Each of the laser diodes can comprise a slow axis and a fast axis. The laser diodes can be oriented within the grid with their respective slow axis and fast axis aligned along a slow axis direction and a fast axis direction respectively. The size of the collimated light beams along the slow axis can be substantially smaller than the inter-diode spacing along the slow axis direction.

It is an advantage of the present invention that the asymmetry of the light beams, which can be seen as a disadvantage in beam combing context, is instead positively used. This is done by arranging substantially identical laser diode packages/laser diodes in a regular grid, the grid comprising a constant grid distance in two orthogonal directions, say horizontal and vertical directions, with their respective slow axis and fast axis aligned. The asymmetry of each of the laser diodes is thereby ordered, and compensation for this asymmetry can be performed more easily. Especially the distance between two laser diode packages can be chosen differently in fast and slow axis direction.

According to preferred embodiments, the orthogonal projections of the cooling channels on the substantially flat surface are extending in between the laser diodes along the fast axis direction. They can be extending substantially or only along the fast axis direction.

As the grid distance can be different in the fast axis direction and the slow axis direction, while providing an optimal beam combination, the region defined by the largest distance (typically along the slow axis direction), allows the positioning of cooling channels in a direction perpendicular thereon, i.e. along the fast axis direction. The asymmetry is thus used in order to create a degree of freedom for design, the degree of freedom being used for providing an improved cooling system, the improved cooling system for instance comprising an improved arrangement of cooling channels.

It will be appreciated by the skilled person that by arranging standard laser diode packages as close as possible together in the fast axis direction (aligned along their fast and slow axis), the corresponding collimated light beams have no or almost no opening between each other in that direction (For TO-9 packages the laser diode packages can for instance be spaced apart (have corresponding "gaps") in the fast axis direction by about 0.5 mm, but this distance can vary on the type of package—for most packages a distance below 2, 1 or 0.5 mm will be possible, or a distance of about 2, 1, 0.5 will be optimal). In the slow axis direction gaps may be automatically present because of the asymmetry of the collimated beam shapes. When beam combining optics has to be or is used to bring the collimated laser beams closer together, the necessary distance/a predetermined place for the cooling channels can be foreseen, and the beam combing optics can be adapted for taking into account the necessary distance/predetermined place.

It will be appreciated that cooling channels may be, or may also be, extending along the slow axis direction, but that additional beam combining optics may then be required, i.e. the collimated laser beams combining means may be adapted for bringing closest neighbor collimated laser beams closer together in the fast axis direction.

According to preferred embodiments, the cooling channels have a variable width, the width being larger in the area with a higher local laser diode density than in an area with a lower local laser diode density.

This provides the advantage that the heat that can be extracted by the cooling channels and can be optimized as a function of the local diode density. Note that within the diode grid, the diode density will typically be constant. At the perimeter of the grid, or at regions within the grid where no laser diodes are present (for instance because of the type of beam combining means or optics used or a non-rectangular shape of the output aperture) less cooling is required, and cooling channels can be relatively narrower.

According to a second aspect of the present invention, a light emitting system is disclosed, comprising at least one laser diode grid element according to any of the embodiments of the first aspect, which further comprises a means for combining the plurality of collimated laser beams into a predetermined output aperture.

This provides an alternative solution for combining a plurality of collimated laser beams into a predetermined output aperture.

According to preferred embodiments, the means for combining the plurality of laser beams is adapted for reflecting the collimated laser beams such that a distance between two adjacent collimated laser beams along the slow axis direction, originating from the same laser diode grid element, in a plane defined by the predetermined output aperture, is smaller than the distance in a plane defined by the respective substantially flat surface.

In a certain view, collimated laser beams, originating from a single grid and being at a certain distance from each other within the grid, can thus be brought closer together when they are passing through the predetermined output aperture.

According to preferred embodiments, the means for combining the plurality of laser beams is adapted for reflecting the collimated laser beams such that a distance between two adjacent collimated laser beams along the fast axis direction, originating from the same laser diode grid element, in a plane defined by the predetermined output aperture, is smaller than the distance in a plane defined by the respective substantially flat surface.

This provided the additional advantage that if the collimated laser beams originating from laser diode packages which are neighbouring in the fast axis direction, but which are not close enough, can further be brought closer together when they are passing through the predetermined output aperture.

According to preferred embodiments, the light emitting system, comprising at least one laser diode grid element according to any of the embodiments of the first aspect, further comprises a means for combining said plurality of collimated laser beams into a predetermined output aperture, the means for combining comprising total internal reflection prisms and/or mirror strips and/or patterned mirrors, wherein the distance between two adjacent collimated laser beams in a plane defined by said predetermined output aperture is smaller than the distance between two adjacent collimated laser beams in a plane defined by the substantially flat surface of the at least one laser diode grid element along the slow and/or fast axis direction.

According to preferred embodiments, the light emitting system comprises at least two laser diode grid elements, and the means for combining the plurality of laser beams is adapted for reflecting the collimated laser beams such that projections on a plane defined by the predetermined output aperture for the collimated laser beams originating from different the laser diode grid elements are interposed between each other.

According to preferred embodiments, the means for combining the plurality of laser beams is adapted for reflecting the collimated laser beams such that the distance between any pair of nearest collimated beams in a plane defined by the predetermined output aperture is smaller than the minimal inter-diode distance along the slow axis direction in a plane defined by the respective substantially flat surface for the respective laser diode grid elements.

According to preferred embodiments, the means for combining comprises flat reflection surfaces. The means for combining can comprise only flat reflection surfaces. The means for combining can comprise total internal reflection prisms or mirrors. The means for combining can comprise at least one patterned mirror. A patterned mirror can for instance be or comprise a flat optical surface with parts of the flat surface being adapted for reflecting light and other parts of the surface being adapted for allowing light to pass through. The pattern could for instance comprise a stripe pattern or a checkerboard pattern.

According to preferred embodiments, the means for combining can comprise an array of reflecting surfaces for reflecting the collimated laser beams through the predetermined output aperture.

The means for combining can thus be simplified when the order is introduced wherein laser diode packages are arranged into a grid structure along a substantially flat surface. This especially when they comprise a slow axis and a fast axis and the laser diode packages are aligned according to these axis within the grid.

According to preferred embodiments, each reflective surface of the array of reflecting surfaces is adapted and arranged for reflecting collimated laser beams of laser diodes positioned along a same row or column of a respective laser diode grid element.

According to preferred embodiments, the light emitting system comprises at least two, or two, laser diode grid elements, a first and a second laser diode grid element, according to the first aspect of the present invention. The respective substantially flat surfaces of the first and the second laser diode grid elements can be substantially parallel.

According to preferred embodiments, the projections of the locations of the laser diodes of the first laser diode grid and the second laser diode grid onto a plane which is substantially parallel with the respective substantially flat surfaces, are interposed. As there is no overlap between collimated laser beams originating from different laser diode grid elements, an optimal beam combining into a predetermined output aperture can be achieved.

According to preferred embodiments, the light emitting system comprises at least three, or three, laser diode grid elements according to the first aspect of the present invention, a first wherein two laser diode grid elements are positioned such that their substantially flat surface comprising laser diodes are substantially parallel and facing each other, and wherein the substantially flat surface of a third laser diode grid is positioned perpendicular thereon.

According to preferred embodiments, the light emitting system comprises at five laser diode grid elements according to the first aspect of the present invention, the five laser diode grid elements being arranged according to a cubic arrangement, the cubic arrangement defining a cube with six surfaces, wherein one of the six surfaces is left open, and wherein the substantially flat surfaces of the laser diode grid elements are facing the internal of the cube and the other respective 5 surfaces.

An optimal, high density beam combining system for combining collimated laser beams is hereby created, which can moreover be optimally cooled.

According to a third aspect of the present invention, an optical component is disclosed for collimating laser beams of a plurality of laser diodes, the plurality of laser diodes adapted for generating a plurality of laser beams and being arranged according to a grid structure on a substantially flat surface, the optical component comprising a single molded array of collimating lenses. The optical component can be a single molded array of collimation lenses.

According to preferred embodiments, the optical component comprises a means for aligning the single molded array of collimating lenses relative to the laser diodes. The alignment means including first adjustment means adapted for controlling the distance and parallelism between the array of collimating lenses and the substantially flat surface along which the laser diodes are mounted, and second adjustment means adapted for aligning the optical axes of the collimating lenses with the center of the laser beams emitted from the laser diodes.

BRIEF DESCRIPTION OF THE DRAWINGS

Further features of the present invention will become apparent from the drawings, wherein:

FIG. 18 illustrates an extension connector according to embodiments of the present invention.

DETAILED DESCRIPTION OF EMBODIMENTS

Figure 1:
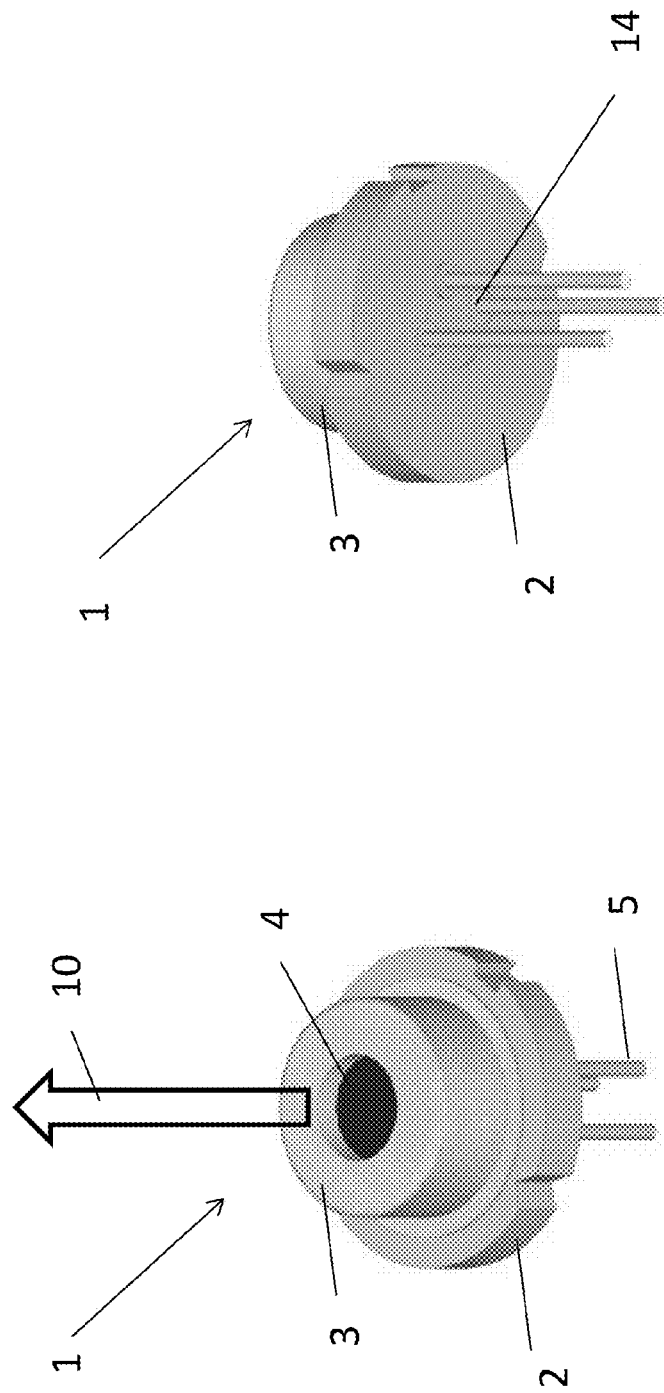
FIG. 1 is a side elevation of a state of the art standard laser diode package.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In the drawings, like reference numerals indicate like features; and, a reference numeral appearing in more than one figure refers to the same element.

In FIG. 1 a standard laser diode package 1 is depicted, often also referred to as diode laser. The laser diode package can for instance be of the type of TO-9, but can be of any other standard or non standard type with similar characteristics, as will be recognized by the skilled person. It can be for instance of the TO-38, TO-56, TO-3, SOT-01, SOT02, CMT02, . . . type. The package is composed of a base plate 2, typically a metal plate, which serves as the cooling surface for the laser. On this cooling plate a metal housing 3 is mounted to protect the actual semiconductor laser. The laser light is emitted as a beam 10 in a direction perpendicular to the cooling plate (upwards in the left pane of FIG. 1) and leaves the TO9 can through a window 4 in the housing. There are typically two or three pins 5 on the back side of the cooling plate, which are used for driving the lasers. These driving pins are typically electrically isolated from the base plate by means of an isolation means 14.

Figure 2:
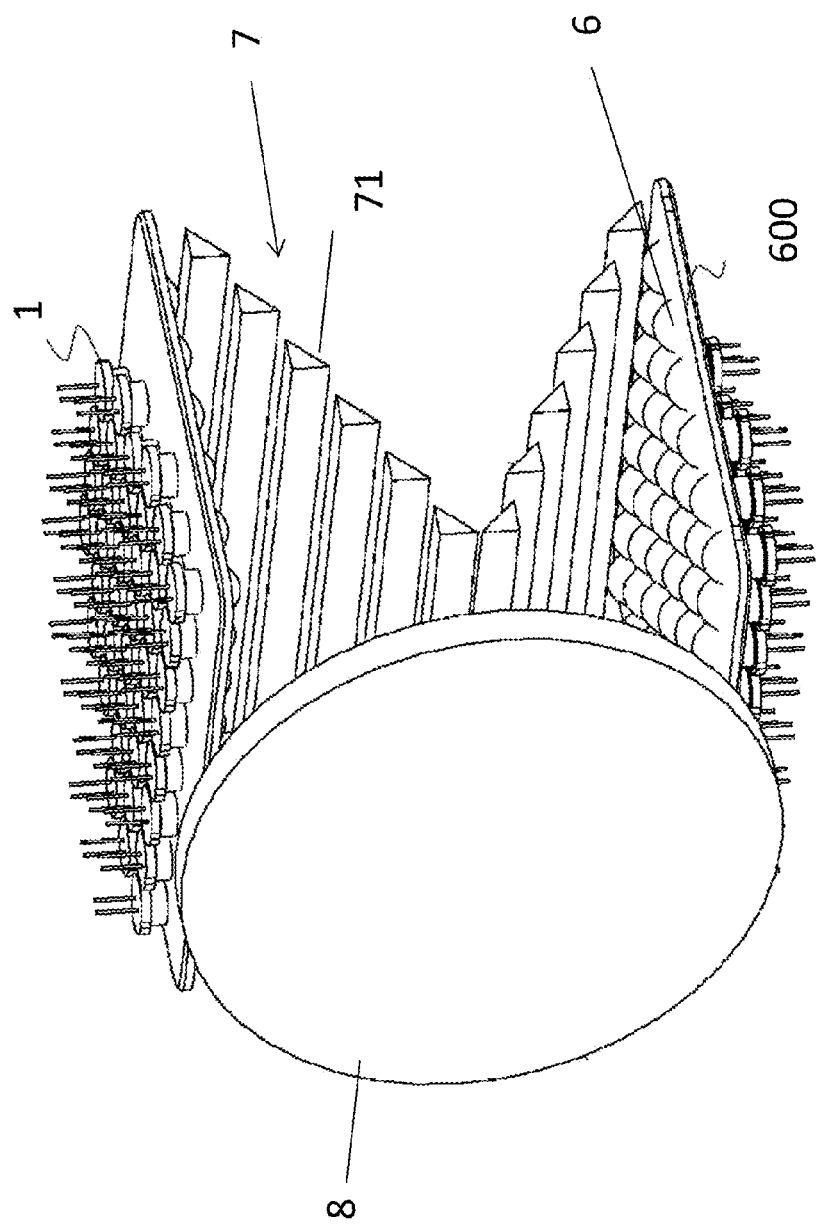
FIG. 2 is a side elevation of an embodiment according to aspects of the present invention, wherein light from two laser diode grid elements is combined into a circular aperture.

According to embodiment of the present invention, illustrated in FIG. 2, the laser diodes, for instance standard laser diode packages 1, are arranged according to two array or grid structures G and G'. The two grid structures G, G', each comprising a plurality of laser diodes 1, adapted for generating a plurality of laser beams 10. The laser diodes of each grid structure are preferably being arranged on a substantially flat surface. The laser diodes of the structures G and G' are facing each other, and the respective substantially flat surfaces are substantially parallel or parallel.

Figure 3:
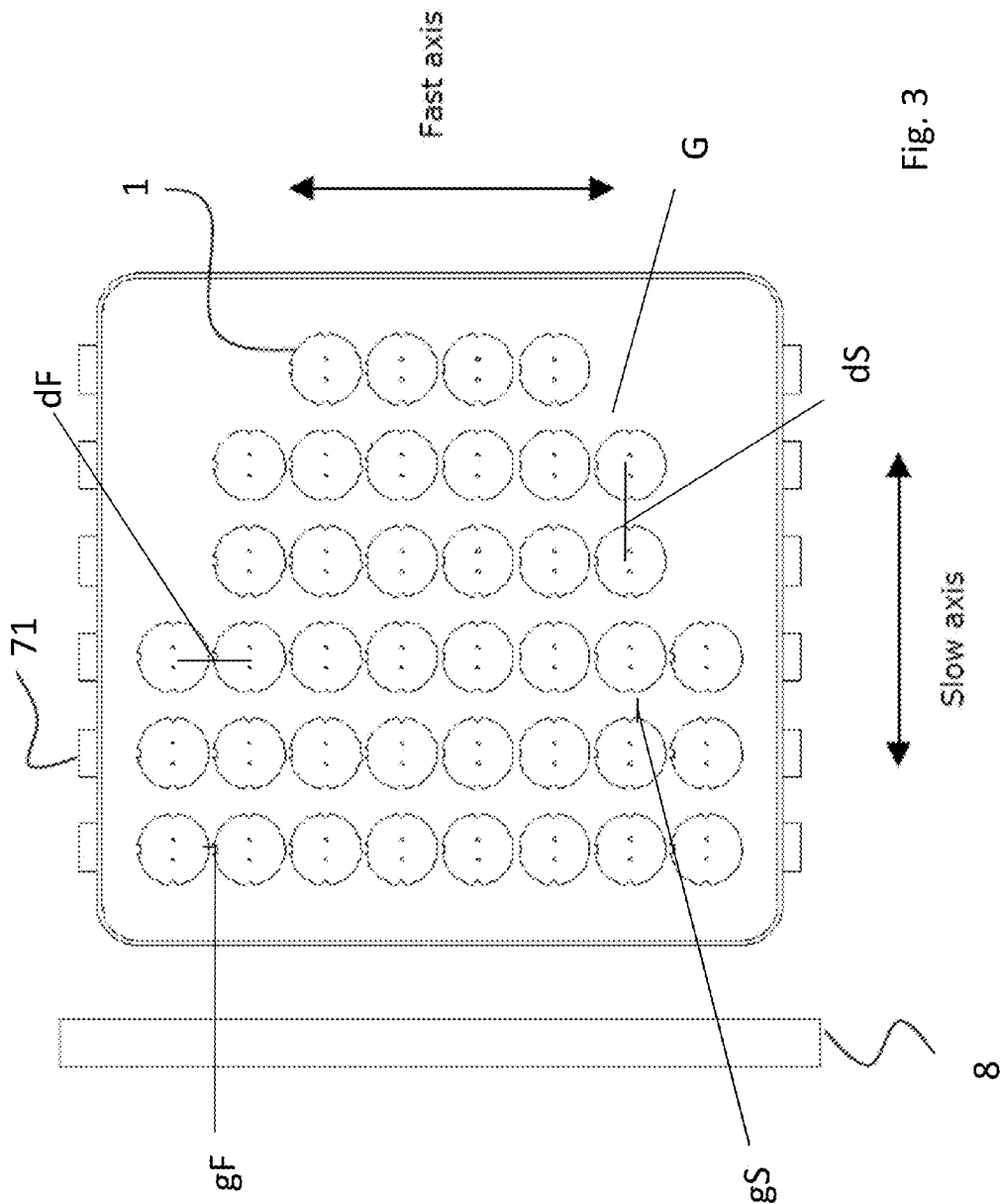
FIG. 3 is a top or bottom view of the embodiment according to FIG. 2.

Each grid structure G, G' typically has a horizontal inter-diode spacing and a vertical inter-diode spacing, as illustrated in FIG. 3, both spacing being along perpendicular directions. According to preferred embodiment, the laser packages are physically aligned along their slow and fast axis within the grid, these axes for instance corresponding to a horizontal and a vertical direction of the grid. The laser diodes are physically spaced together as close as possible in the direction of the fast axis of the diode, at a corresponding distance dF between the laser beams. In the direction of the slow axis of the diode lasers the packages are physically spaced further apart, at a corresponding distance dS between the laser beams. As will be discussed further this spacing is instrumental to enable the cooling of the lasers.

The distances, also called spacings, between laser diodes, laser beams or collimated laser beams are considered as being the distances between the centers of the associated laser beams or collimated laser beams. It will be recognized that a spacing between laser beams can be mapped uniquely on a gap between laser diodes or laser diode packages and that relations expressed between (collimated) laser beams can be mapped on relations between laser diodes or laser diode packages. For the purpose of the present invention, the terminology "gap" (gS: along the slow axis, gF: along the fast axis) is used when referring to the actual space in between laser diode packages.

A collimating lens 6 is foreseen for each laser diode 1, adapted for generating a collimated light beam 101 from a corresponding laser beam 10, the collimated light beam being substantially perpendicular on the substantially flat surface. Here the set of collimating lenses is provided as an array 600 for each grid structure, formed from a single mold. This is advantageous as will be described further, but is not strictly necessary.

A means for combining the plurality of collimated laser beams 7 into a predetermined output aperture 8, here a circular aperture, is provided. Here, a set of total internal reflection prisms 71—having flat surfaces—is used. Alternatively, or in combination therewith, a set of flat mirrors or flat patterned mirrors can be used. Examples thereof are described further on.

The one or more grids can further be defined by one or more outer perimeter(s). This outer perimeter of the laser diode grid depends on the predetermined output aperture, the number of grids (thus grid elements) from which collimated laser beams have to be combined; as well as on the specific type of means for combining collimated laser beams. The outer perimeter can for instance describe half an ellipse, or half a circle when combining towards a circular output aperture is envisaged by means of a means for combining which comprises only flat reflection surfaces.

At the more generic level, the size of the collimated light beams along the slow axis is thus substantially smaller than the inter-diode spacing along the slow axis direction. For example with a typical divergence angle of 25° in the slow axis and 50° in the fast axis, the size of the collimated light beam will only be half as wide in the slow axis direction than it is in the fast axis direction. If the inter-diode spacing is minimized along the fast axis and the collimating optics are designed such that the width of the collimated beam along the fast axis closely fits this spacing, the size of the collimated beam along the slow axis will be 50% or less of the inter-diode spacing along the slow axis. The means for combining the plurality of laser beams is adapted for reflecting the collimated laser beams such that a distance dSA between two collimated laser beams, corresponding to two adjacent laser diodes along the slow axis direction, along a plane defined by the predetermined output aperture, is smaller than the distance dS along a plane defined by the substantially flat surface. According to further embodiments, this can also be performed analogously for the fast axis (distances dFA and dF).

Referring to embodiment illustrated in FIGS. 2 till 7, the larger spacing between the lasers along the slow axis is condensed by using a set of mirroring surfaces at a 45 degree angle. To reduce the path length of the collimated beams advantageously the total amount of lasers is split into two halves, corresponding to two grid structures. Within each halve the lasers are arranged within the perimeter of half an ellipse. The combined beams after condensation of the spacing along the slow axis approaches a circular shape and is aimed towards a circular aperture, as illustrated in FIG. 2.

The top view in FIG. 3 illustrates the distribution of the diode lasers across one half of the array. The packages are spaced as close as possible along the fast axis of the diode lasers (distance dF, gap gF), while leaving a gap gS, corresponding to a distance dS, along the slow axis between adjacent laser packages. Further the different rows and columns are populated with laser diodes to approximate an elliptical shape.

In addition to a difference in pitch along the slow and fast axis there is also a difference in amount of lasers along the direction of the slow axis. Since the beam waist after collimation is smaller in the direction of the slow axis, more lasers can be fitted in this direction.

Figure 4:
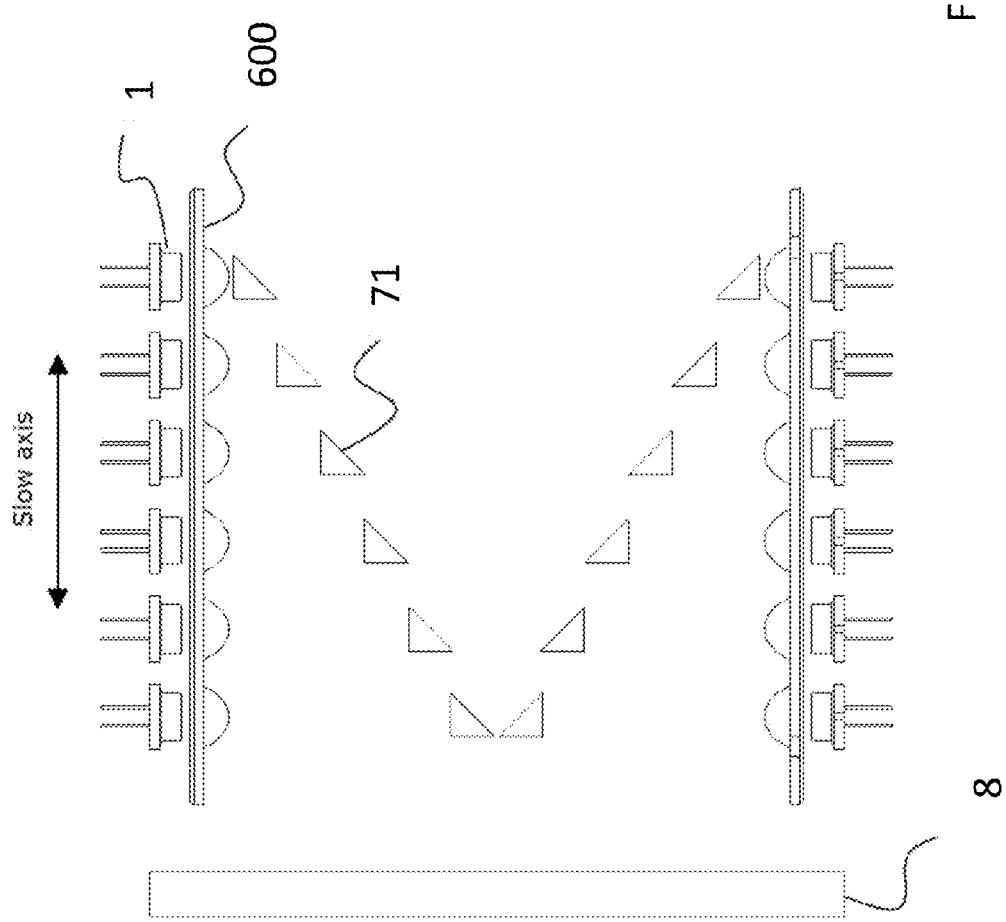
FIG. 4 is a side view of the embodiment according to FIG. 2

FIG. 4 shows a side view of the laser array beam combining. The spacing of the TIR reflecting prisms is chosen to condense the distance that exists between adjacent lasers along the slow axis of the laser diodes. The TIR reflecting surfaces at the same time combine the 2 halves of the laser grid into a common circular aperture.

Figure 5:
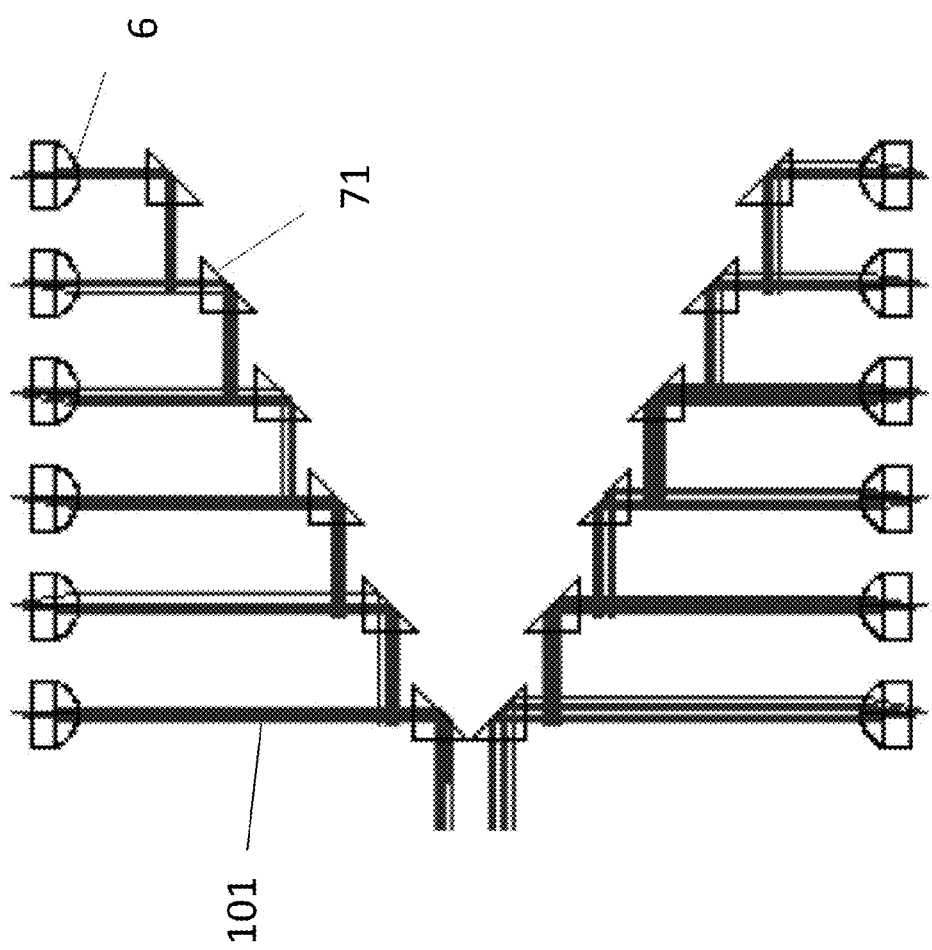
FIG. 5 is a ray tracing schematic of the embodiment depicted in FIG. 2, corresponding to the view of FIG. 4.

In FIG. 5 the optical ray tracing of the beam combiner according to FIGS. 2 to 4 is illustrated, for the collimated laser beams 101.

First the laser beams 10 are collimated by means of the collimation lens array 600. This lens array consists of aspherical lenses which efficiently collimate the light over the wide range of angles emitted by the laser. Spherical lenses can be used too, but they typically result in a less collimated beam, which can though be sufficient overall. The lasers are preferably collimated such that the maximum divergence is smaller than 0.25° degrees. In one direction the divergence is somewhat larger than the other direction. This can be solved by using two arrays of cylindrical lenses, as this is known to the skilled person. One of those arrays of cylindrical lenses may be comprised inside the laser package.

Figure 6:
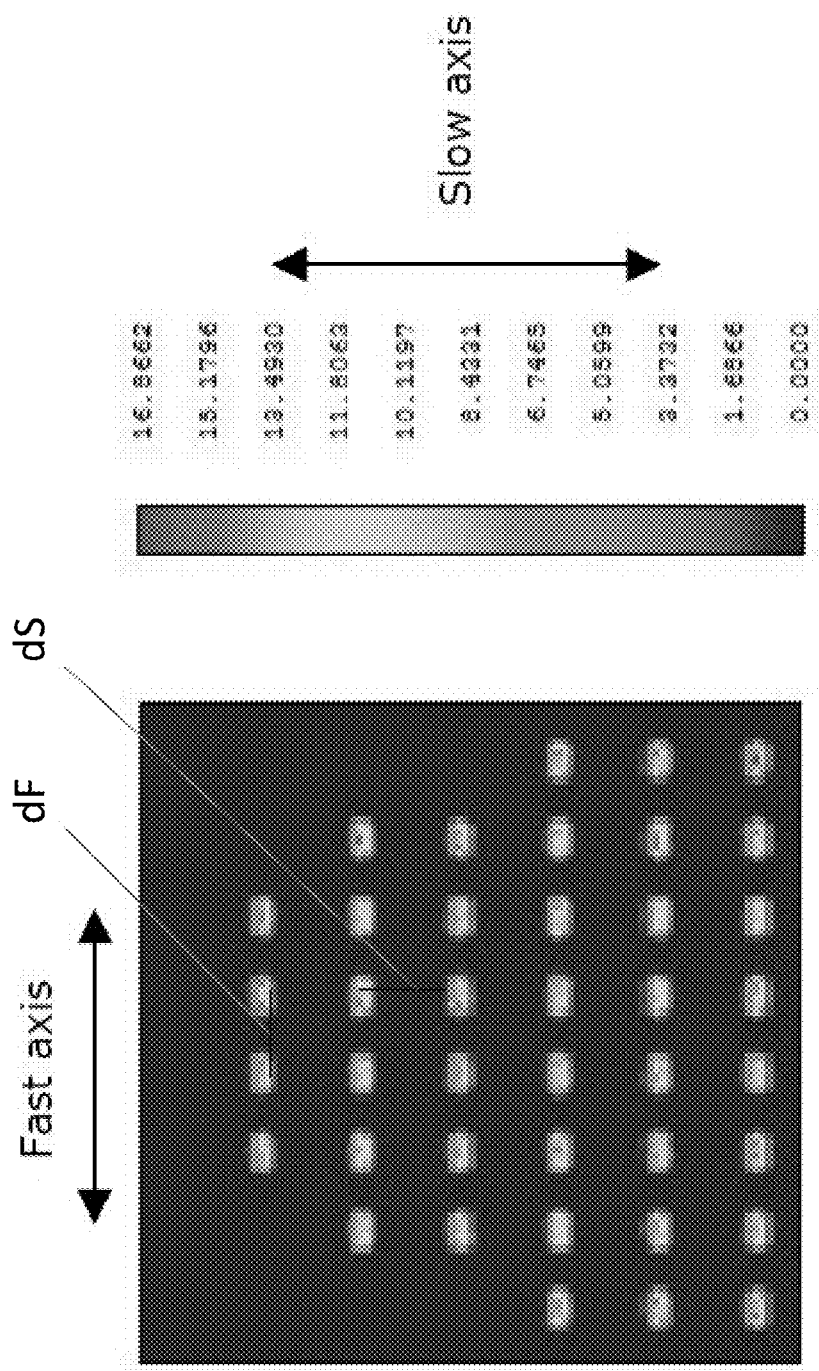
FIG. 6 illustrates the laser beam distribution after collimation, for a single grid of laser diodes, according to embodiments of the present invention.

However, the use of a single lens per laser diode is preferred. One or more further lenses per diode may be used, but this adds a second or further optical component that has to be aligned with respect to the laser beams. In addition, due to the mechanical tolerances of the lasers inside the standard, e.g. TO-can packages, a better collimation can in practice not be obtained. The result is a laser beam that is very well collimated, but its geometrical shape is asymmetric: it is much wider along the fast axis. This is illustrated in FIG. 6.

Next, the distances between the collimated beams along the slow axis dS are reduced by means of an assembly of beam combining prisms. Each line of laser beams is reflected by the corresponding prism in a direction parallel to the laser array. By choosing an appropriate spacing between these beam combining prisms, the distance between the laser line beams, can be greatly reduced to dSA. Preferably dSA is chosen to be a bit larger then the beam waist along the slow axis, as it makes the system tolerant enough for the precision of the mechanical and optical components, while still capturing all of the available light.

Now a combined laser beam is obtained that is well collimated and of which its intersection is as small as possible. The shape of the combined laser beam should be adapted to the remaining optical system of the projector. In case the lasers are focused into e.g. an integration rod by means of a condensing lens, the combined beam, after the beam combining prisms preferably is circular.

Figure 7:
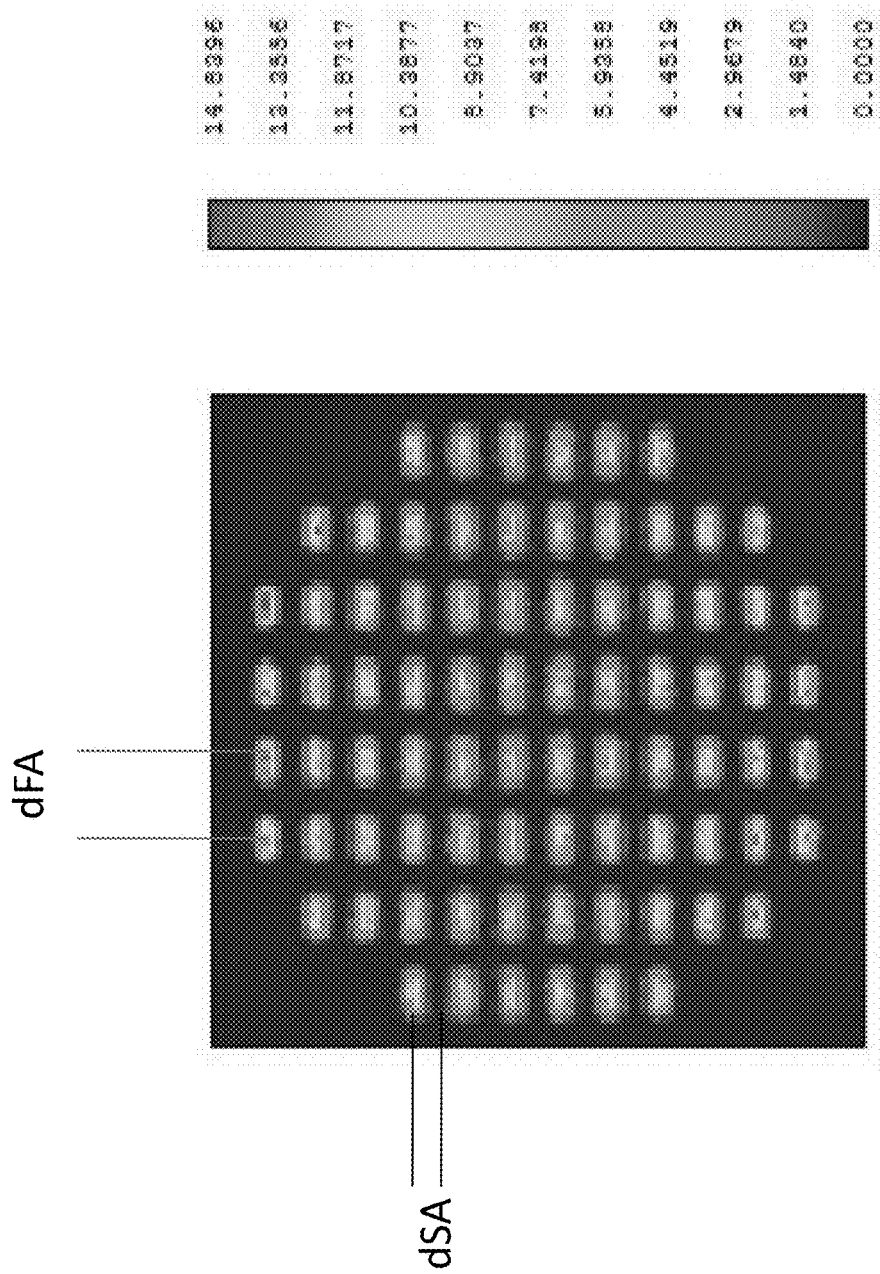
FIG. 7 illustrates the collimated laser beam distribution at a circular output aperture, when collimated laser beams are combined from two different laser diode grid elements, according to embodiments of the present invention.

This can be done by arranging the lasers into two grid structures each fitting within a half ellipse perimeter. In combination with the condensing and beam combining achieved by the positioning of TIR prisms, the circular aperture of the projector is nicely filled with light, as is illustrated in FIG. 7. Uniform filling of the aperture of the projector, generates maximal light output and delivers optimal uniformity as well as reduced speckle contrast of the projected image.

Alternatively, a circular filling of the aperture can also be achieved by arranging all diode lasers in a single grid structure within an elliptical perimeter. However this increases the total footprint and the path length of the collimated beams, thereby increasing the tolerance sensitivity.

For example, in the case of TO-9 packages, the laser cooling plate is 9 mm in diameter. Taking into account a minimal spacing between packages determined by the space required for the mechanical system that holds the lasers (gF=0.5 mm) an inter-diode spacing dF of 9.5 mm along the fast axis can be achieved. The same spacing is present between adjacent beams along the fast axis at the position of the output aperture (dF=dFA). The collimation lenses 6 are designed such that the beam waist in the direction of the fast axis at the position of the output aperture is almost equal to the spacing dFA. Preferably it is a bit smaller to account for mechanical and optical tolerances as illustrated in FIG. 7.

However the beam waist after collimation is much smaller in the slow axis direction. Even if the same inter-diode spacing was used in the direction of the slow axis, without any further measures, this will result in a loss of the available étendue as about half of the available space at the output aperture remains unused.

The beam combining optics allows to avoid this loss and accommodate a wider gap between the packages, in the direction of the slow axis (for example gS=3 mm). The inter-diode spacing along the slow axis can thus be increased to dS=12 mm. This wider spacing is beneficial for the cooling system, as it results in an additional space for the cooling channels in the wafer-like liquid cooling block. As such the problem of the limited space for the cooling is solved.

The beam combining optics will reduce the space between collimated beams in the slow axis direction at the position of the output aperture dSA to be almost equal to the beam waist in the direction of the slow axis. Preferably the beam waist is a bit smaller than dSA to account for mechanical and optical tolerances. For example dSA=5.5 mm.

As stated above, the systems according to embodiments of the present invention are arranged and adapted such that preferably small openings exist between the different collimated laser beams in order to accommodate any optical and/or mechanical tolerances and still capturing all of the available light and maximize the light efficiency.

In some applications it can be desired to further increase the amount of lasers that can be coupled into the circular aperture, even if a small percentage of the light may be lost, for instance in worst case tolerance conditions.

Figure 8:
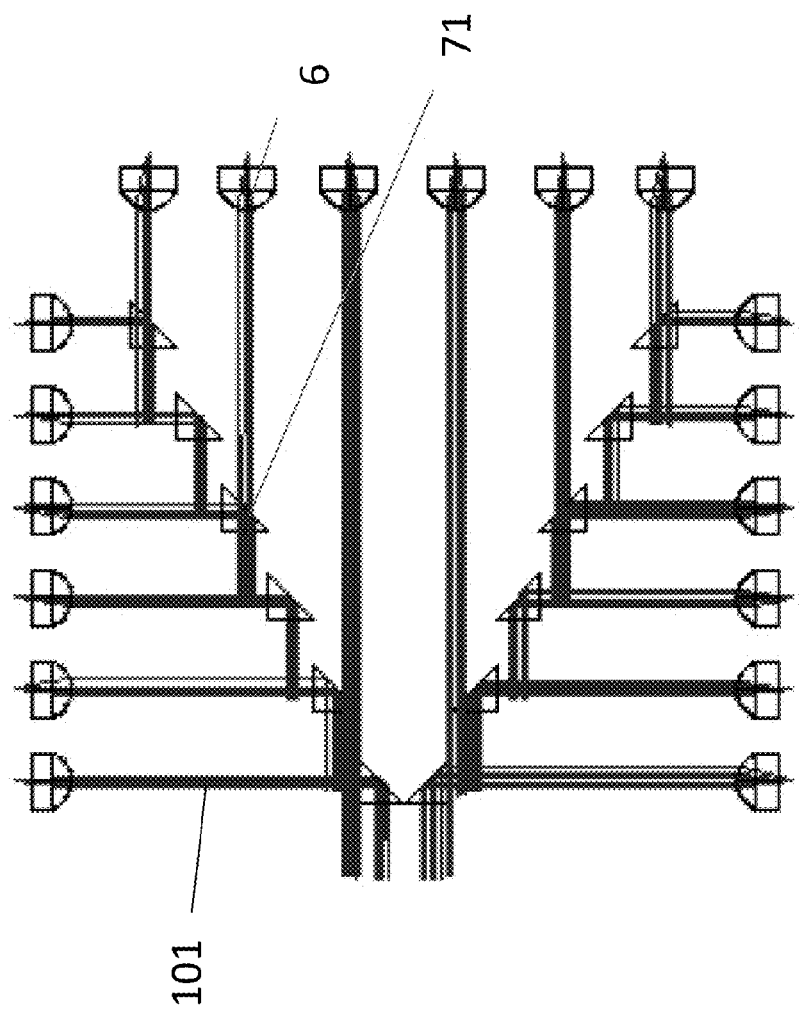
FIG. 8 is a ray tracing schematic, similar to FIG. 5, of another embodiment of the present invention, wherein collimated laser beams from three laser diode grid elements are combined in a circular output aperture.

In such applications the openings remaining in between the individual laser beams (e.g. along the fast axis) can be filled by placing a third grid of diode laser perpendicular to the two halves as illustrated in FIG. 8. The strips of TIR prisms are now interrupted at the positions where the light rays from the third laser array are passing.

Figure 9:
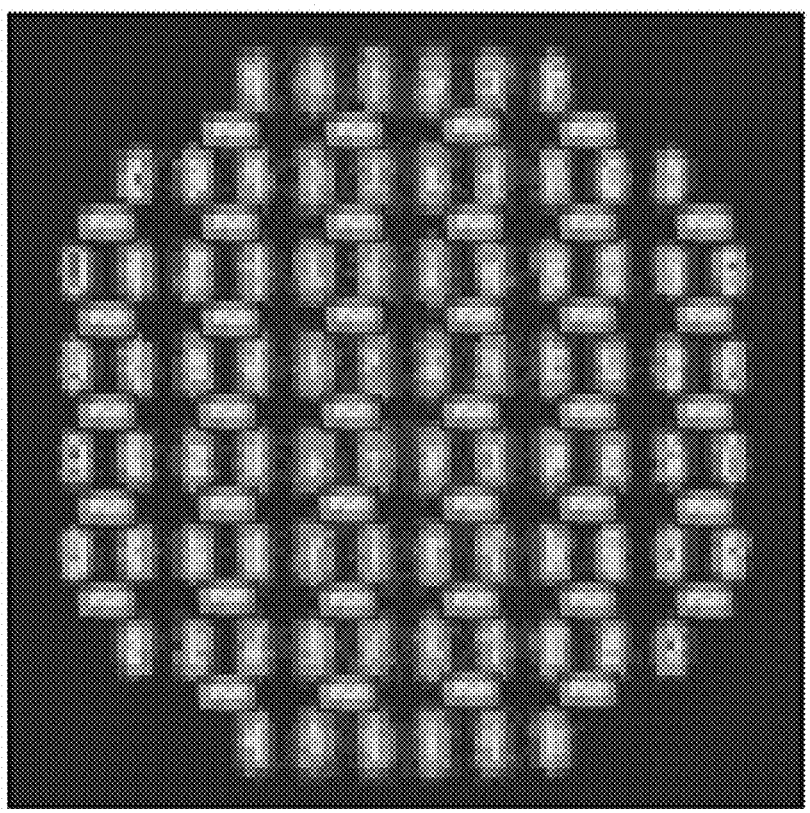
FIG. 9 illustrates the collimated laser beam distribution at a circular output aperture, when collimated laser beams are combined from three different laser diode grid elements, according to embodiments of the present invention.

If the polarization of the combined laser bundle is not or less important, the orientation of the laser beams from the third grid can be turned 90 degrees versus the orientation of the laser beams from the first and second grid. Then the lasers in the third grid are positioned as close as possible along the slow axis while a wider spacing is provided along the fast axis to allow liquid cooling channels to pass between the lasers in the direction of the slow axis. This way an aperture filling as illustrated in FIG. 9 can be obtained where the residual spacing along the fast axis after combination of the first and second grid structure is filled with light from the third grid structure.

Figure 10:
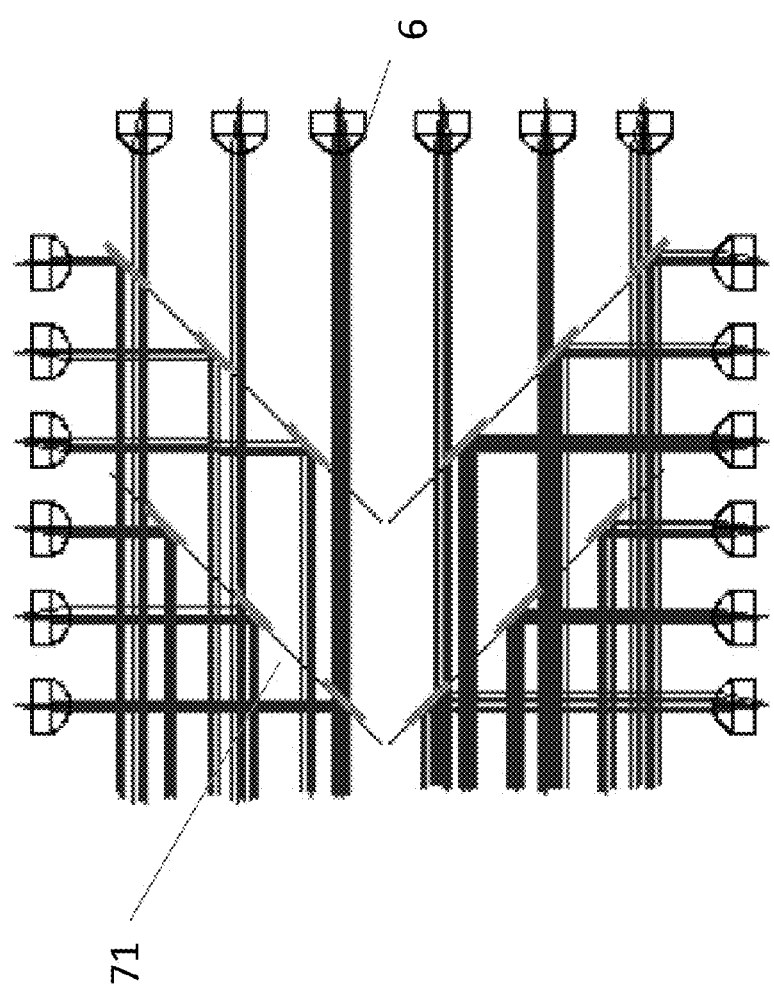
FIG. 10 is a ray tracing schematic, similar to FIG. 8, for another embodiment according to the present invention, wherein collimated laser beams from three laser diode grid elements are combined in a circular output aperture, and wherein the means for combining comprises patterned mirrors.
Figure 11:
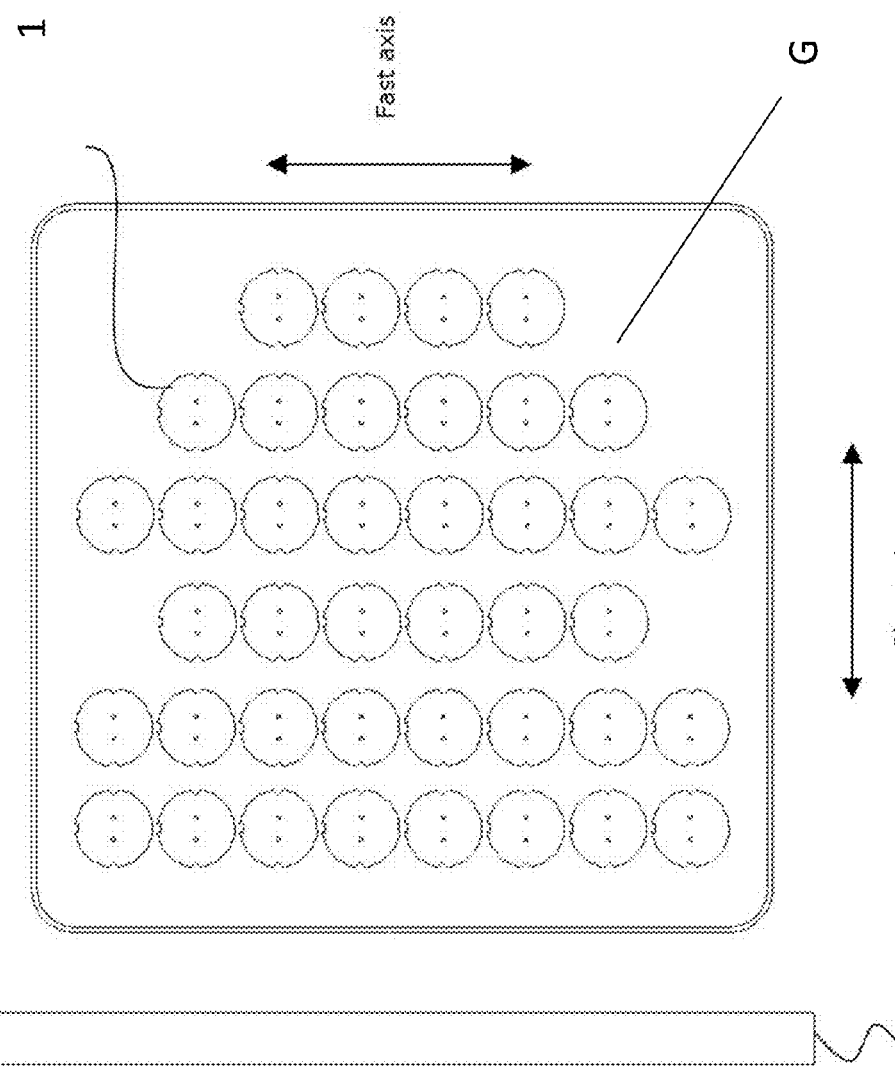
FIG. 11 is a side view of the embodiment depicted in FIG. 10.

Alternative to the use of TIR prisms, it is also possible to use a set of patterned mirrors, which contain a reflective portion where the light from the lasers is to be deflected, e.g. at 90 degrees, and a transparent portion where the light of other lasers needs to pass. Such mirrors can be created with any two dimensional pattern and provide more flexibility to interleave the laser beams in two directions. For example in FIG. 10 the top and bottom arrays are interleaved in the vertical direction while the right array is interleaved in the depth direction. Since now non-adjacent rows of lasers are interleaved, the distribution of lasers to approach a circular aperture filling, now no longer fits within an elliptical perimeter as illustrated in FIG. 11.

Figure 12:
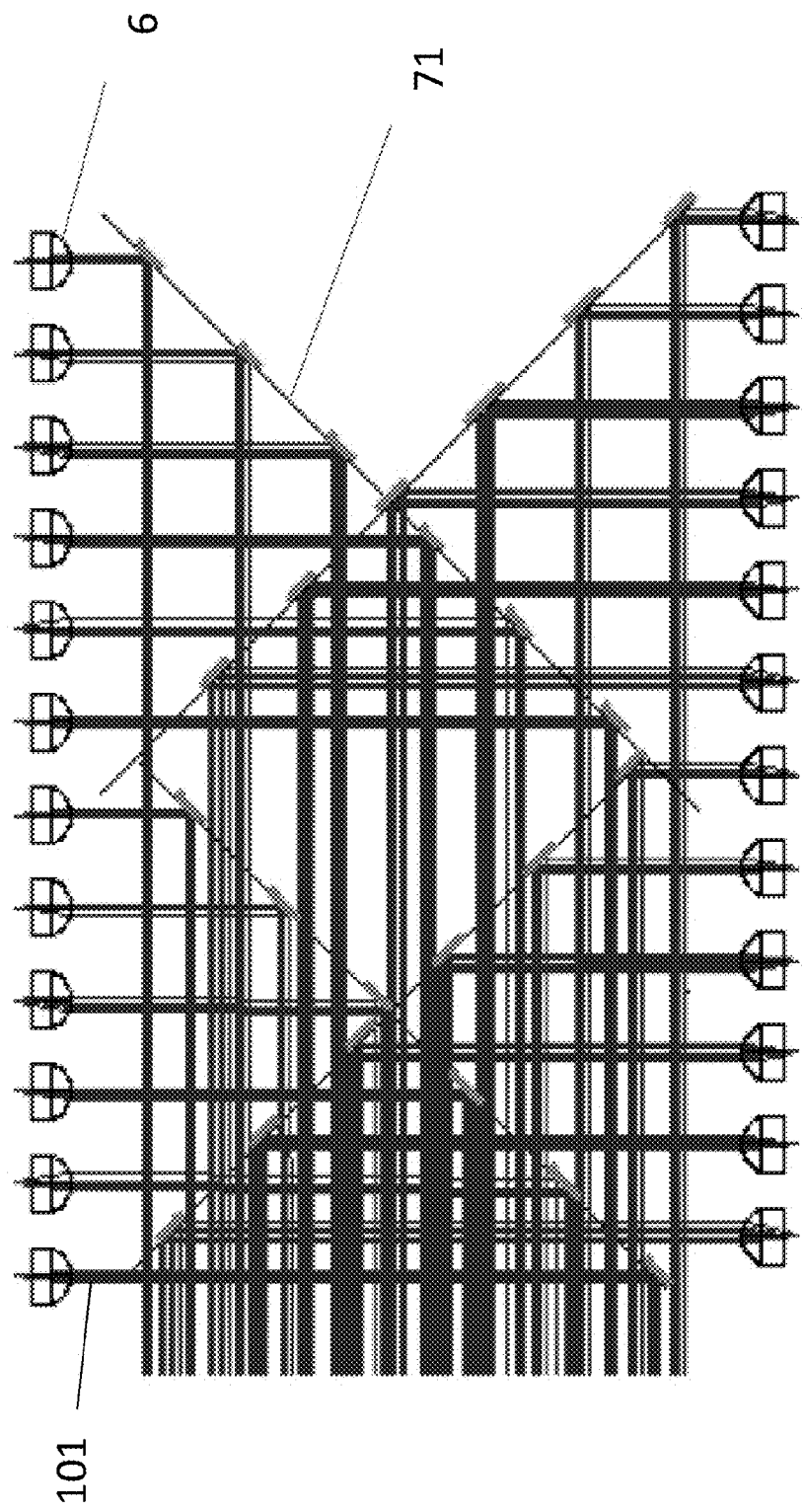
FIG. 12 is a ray tracing schematic of a further embodiment according to the present invention.

Another solution to fill the remaining openings along the fast axis of the lasers is to use a setup with only a top and bottom grid, however with each array arranged to fill the entire circular aperture. By means of a relative offset between the top and bottom grids the beams can be interleaved in one or two directions. This is illustrated in FIG. 12. Such interleaving enables a wider spacing of the laser packages in the array also along the fast axis. In this setup cooling channels could be oriented then also along the slow axis. With such a setup it is possible to have the same orientation of the lasers in both arrays if the combined beam is desired to be polarized. On the other hand it is possible to have orthogonal orientation if the combined beam is desired to be unpolarized.

Figure 13:
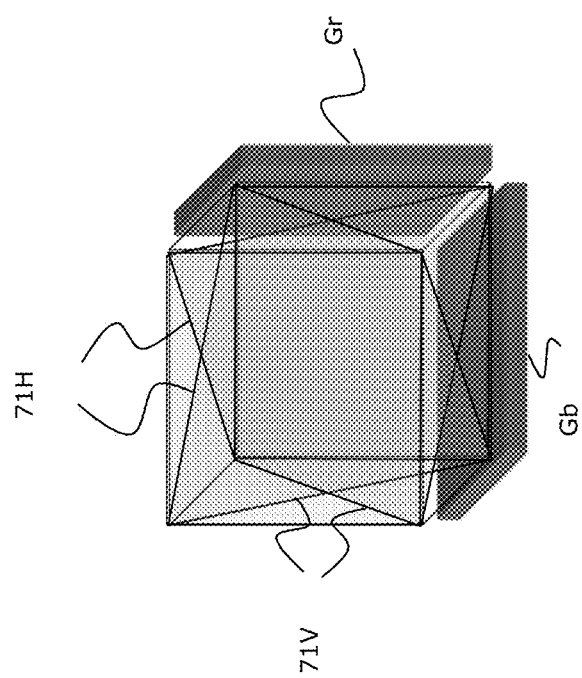
FIG. 13 illustrate a further embodiment according to aspects of the present invention, wherein collimated laser beams originating from four different laser diode grid elements is combined into a circular aperture

To decrease the path length and enable a more compact setup, it is also possible to use four grids (and thus grid elements). Two positioned at the top and bottom (Gt—not depicted, and Gb) and two positioned at each side (Gl, not depicted, and Gr). This is illustrated in FIG. 13. A first set of crossed patterned mirrors 71H are used for the horizontal combination of the left and right grid elements. A second interwoven set of crossed patterned mirrors 71V are used for the vertical combination of top and bottom grids.

Figure 14:
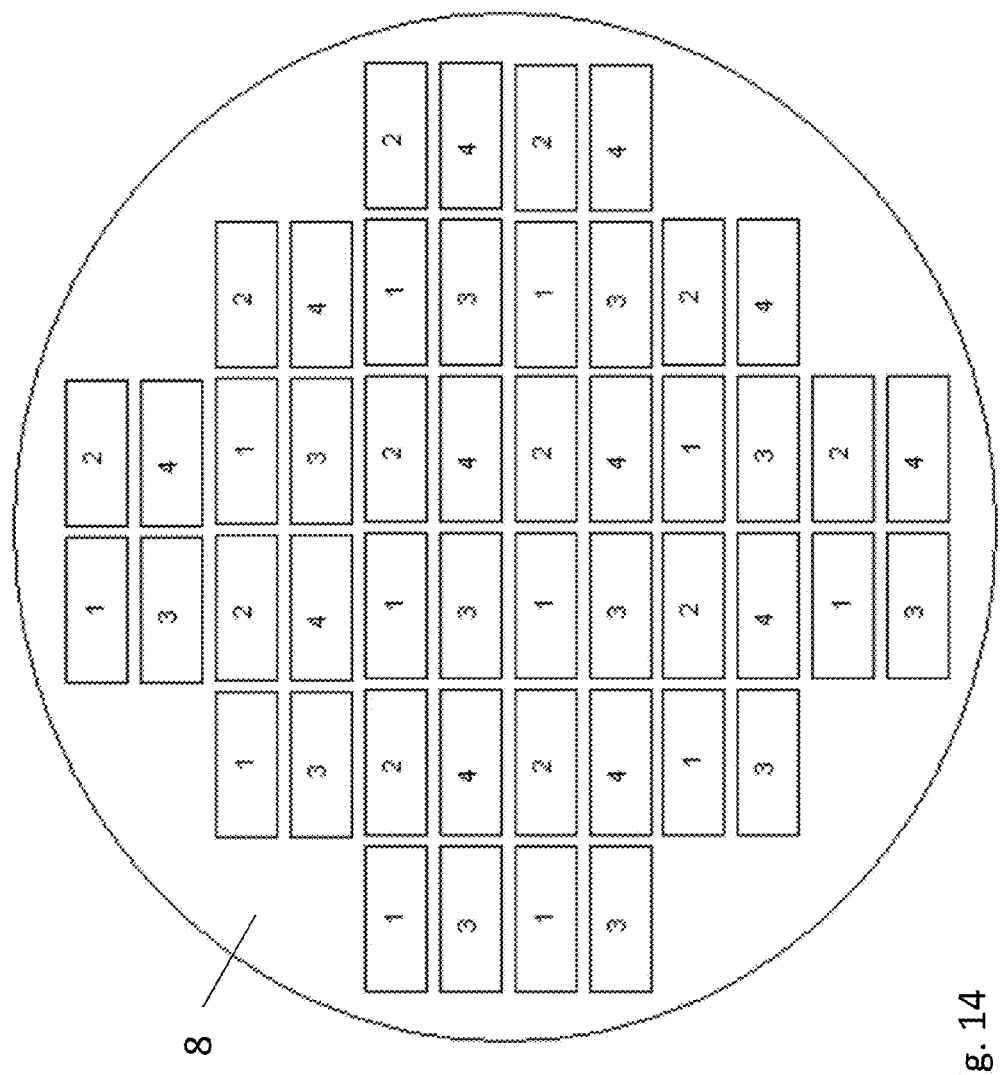
FIG. 14 illustrates the filling of the circular aperture by collimated laser beams originating from four different diode laser grid elements.

Except for the different path length the setup of FIG. 12 and FIG. 13 is similar, in both cases four circular patterns of lasers are interleaved to fill the complete aperture as illustrated in FIG. 14, where the numbers within the array correspond to respective grid elements of the four laser diode grid elements wherefrom the collimated laser beams are originating. The patterned mirrors should be transparent at the positions where light rays from other arrays are required to pass.

According to a further example, combinations of the above architectures are possible. The setups of either FIG. 12 or FIG. 13 could be combined with an additional laser array in the back. Should interleaving of four circular patterns of lasers still not yield the desired spacing between adjacent laser packages in the array, then interleaving of up to eight circular patterns of lasers is possible if the architecture of FIG. 13 and FIG. 14 are combined.

Figure 15:
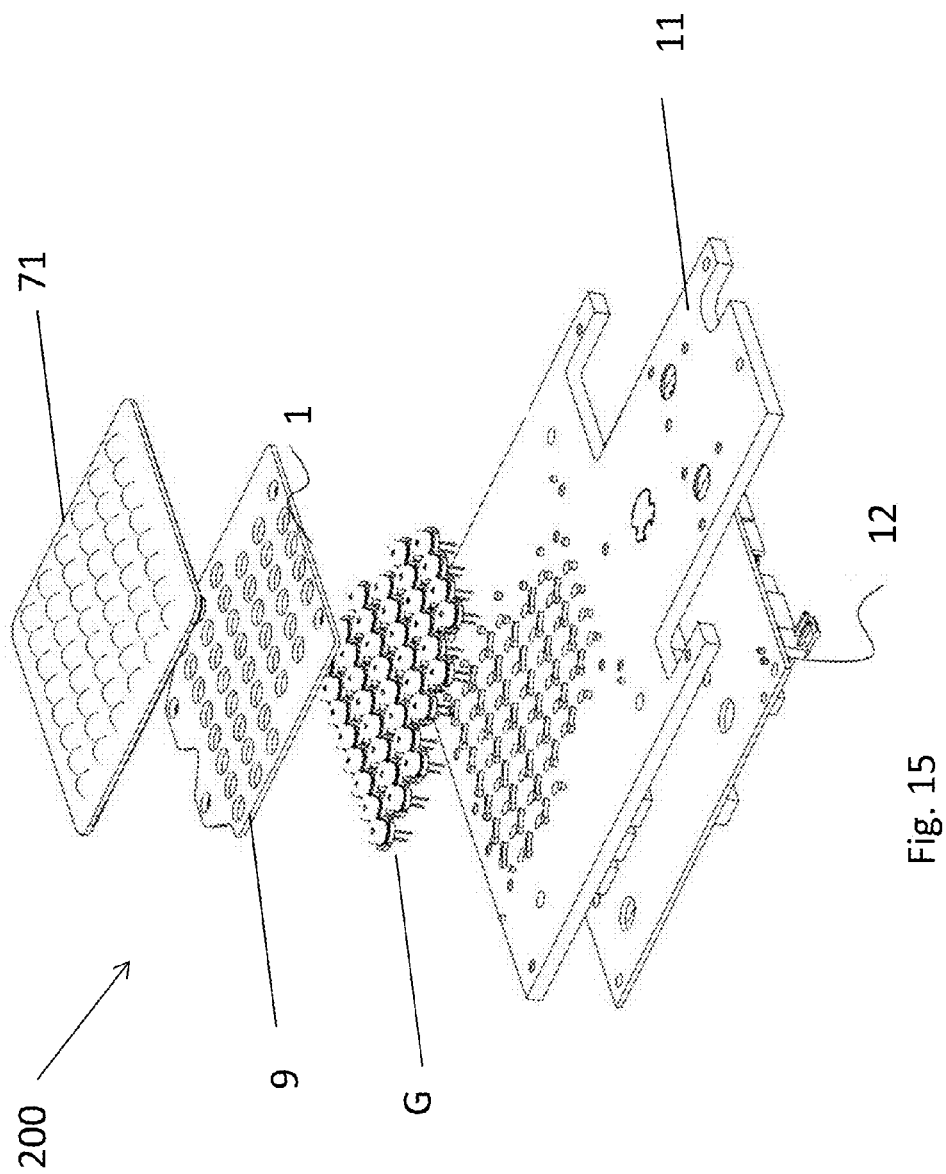
FIG. 15 is a perspective view of a laser diode grid element according to aspects of the present invention, corresponding for instance with a single laser diode grid.

The grids G, G' of laser diodes 1 and collimator lenses 6, by means of a molded array 600, are comprised in an assembly 200 together with the laser driving board 12 and the heat sink, e.g. a liquid cooling heat exchanger 11. In FIG. 15 the main parts of the assembly are shown. The TO9-can type packages of the diode lasers 1 are in direct contact with the liquid cooling heat exhanger 11 (a thermal paste is applied in the contact area to guarantee optimal thermal conduction) that contains channels 111 to allow the passing of a cooling fluid. A printed circuit board 12 is positioned in the back of the liquid cooling heat exchanger 11 to connect the laser diodes 1. Connections can be made through soldering, or via a connector system 13 as will be discussed with respect to FIG. 16. The thickness of the liquid cooling heat exchanger is limited by the length of the connections, which in the case of standard TO-9 can and direct soldering is about 5 mm. The printed circuit board can also contain active circuits to drive the diode lasers 1. Then, advantageously a thermally conductive interface pad can be used in between the printed circuit board 12 and the cooling plate 11 to also guide the heat from the driver circuits better to the heat sink. Alternatively, when the heat sink is dimensioned only based on the cooling capacity for the plurality of laser diodes, an thermally insulating interface pad can be provided in between in between the printed circuit board 12 and the cooling plate 11.

The positioning of the individual lasers in the array needs to be precisely controlled. Therefore the substantially flat surface of the heat sink can be equipped with mechanical references (e.g. dowel pins). In a preferred embodiment the base plate of the laser diode packages is pushed against these echanical references by means of a positioning plate 9 and springs. The positioning plate 9 and the springs can guarantee that the laser packages are maintaining into a well defined position versus the substantially flat surfaces and its mechanical references, and therefore a precise relative positioning and spacing of all the lasers in the array or grid. In case of a fixed connection between the lasers 1 and the driver PCB 12, the positioning plate 9 and springs are preferably mounted prior to soldering of the laser diodes 1 onto the PCB. The aspherical collimating lenses 7 are preferably molded in one single glass piece 71, as such the relative positioning and spacing between the lenses is inherently guaranteed, and matched to the positioning and spacing of the laser diodes in the array/grid. The completed array/grid of collimating lenses 71 is mounted with adjustments relative to the substantially flat surface of the heatsink and therefore relative to the laser diodes.

Figure 16:
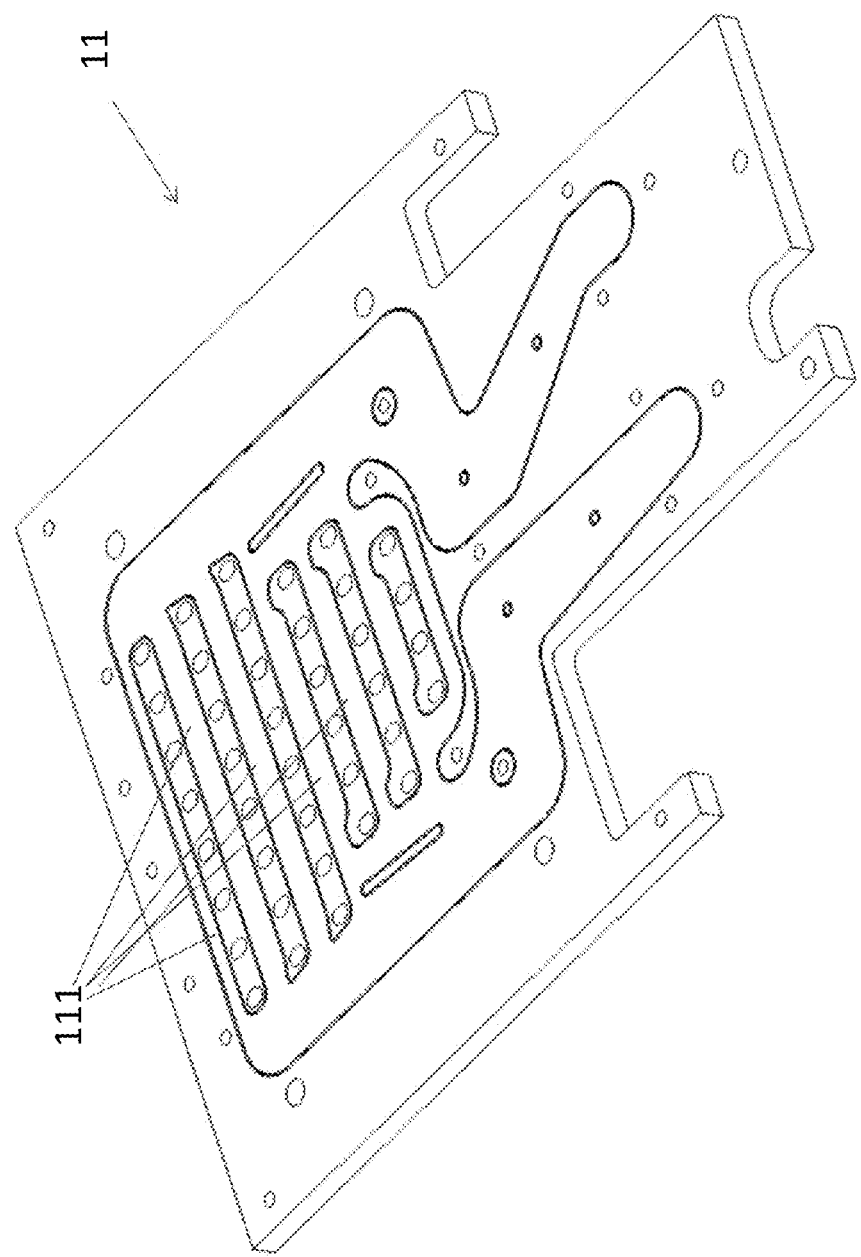
FIG. 16 is a perspective cross sectional view of a liquid cooling plate used in the assembly depicted in FIG. 15.

FIG. 16 provides a cross section of the liquid cooling plate 11. The increased distance in between the laser diodes along the slow axis enables transversal cooling channels 111 in between the rows of laser diodes 1. The shape of the cooling channels 111 is optimised to distribute the flow of cooling fluid proportionally with the heat load along each channel 111. Wider cooling channels are provided as the number of lasers per row increases towards the centre of the ellipse. Hence the flow rate increases in these channels that have to transport more heat, and temperature differences between different positions in the array are minimized.

Figure 17:
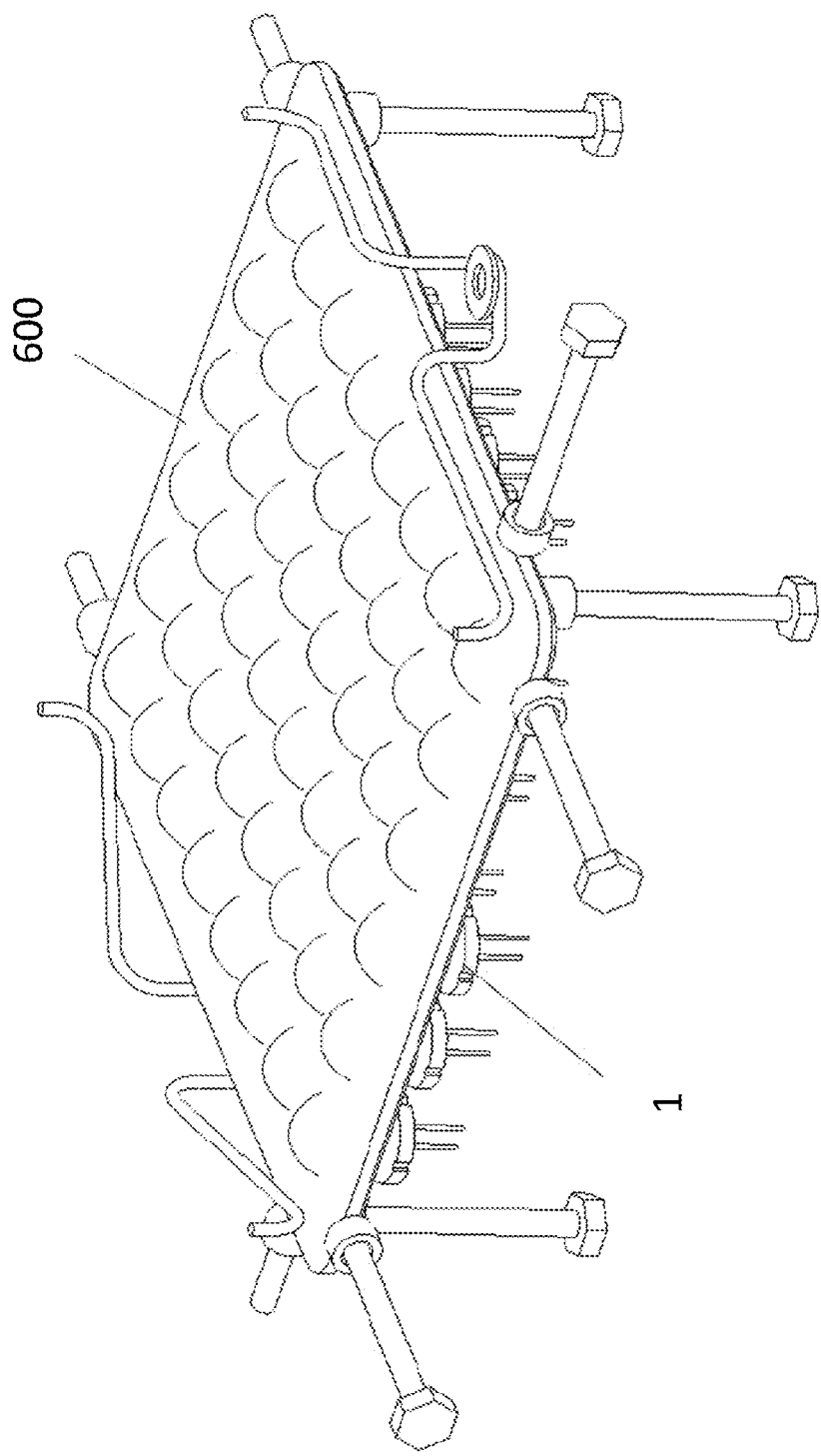
FIG. 17 is a perspective view of an adjustment means for a collimating lens array according to aspects of the present invention.

The aspheric collimation lenses are molded in one single glass piece 71, and reference planes can be molded with the lens surface to serve as a mechanical reference. The lens array is preferably adjustable with respect to the laser diodes and the substantially flat surface. In FIG. 17 it is illustrated how a system of screws and springs enables adjustment with the full six degrees of freedom (position and tilt along the three axes) to perfectly position the lens array to be in alignment with the laser array and adjust the plane of focus. Theoretically the plane of focus of the collimation lenses is aligned as close a possible to the position of the exit facet of the laser diodes. In absence of tolerances the combined laser beam will then be almost perfectly collimated. If a condensing lens is focusing the light into a light integrating rod, such a near perfect focus might not be preferred. It may create a very high local intensity, which may be disadvantageous for uniformity mixing in the integrator rod, or even cause damage. Therefore it can be preferred to adjust the focus of the collimating lenses to deviate a bit from perfect collimation, as long as it does not compromise the light output of the projection system. This means the angular deviation from perfect collimation should still be small enough so that all the light can be coupled to the entrance of the integrator rod.

The connection between the laser diodes 1 and the printed circuit board 12 can be made through direct soldering. While this approach is relatively simple, it may also have disadvantages. The maximum thickness of the liquid cooling plate is for instance limited by the length of the leads of the TO-9 package. Moreover, the laser is position restrained by both the soldering and the clamping by the positioning plate onto the liquid cooling plate, which may induce mechanical stress, for example caused by temperature variations. E.g. when starting up or shutting down.

Advantageously, a connector extension system 13 comprising connectors 130 is used to allow for electrical contact, without disturbing the fixed optical and mechanical positioning of the lasers. Small misalignments of the PCB 12 can be corrected due to the flexibility of the connectors 130. The connector can also extend the space between the printed circuit board 12 and the laser diodes 1 to enable additional thickness of the liquid cooling heat exchanger 11. In FIG. 18 a possible implementation of such a connector extension 130 is illustrated. The extension connector 130 comprises a clamp spring section in the middle to guarantee good contact with the leads (driving pins) of the TO-can while allowing the leads to freely move and adjust. On the other side solder pins 131 can be received. An isolation means as for instance a tube 132 can be provided. The isolation means 132 slides over connector extension 130. As in the final assembly both parts protrude the liquid cooling heat exchanger 11, the isolation 132 prohibits electrical contact between the connector and the liquid cooling heat exchanger.

It is to be understood that the invention is not limited to the particular features of the means and/or the process steps of the methods described as such means and methods may vary. It is also to be understood that the terminology used herein is for purposes of describing particular embodiments only, and is not intended to be limiting. It must be noted that, as used in the specification and the appended claims, the singular forms "a" "an" and "the" include singular and/or plural referents unless the context clearly dictates otherwise. It is also to be understood that plural forms include singular and/or plural referents unless the context clearly dictates otherwise. It is moreover to be understood that, in case parameter ranges are given which are delimited by numeric values, the ranges are deemed to include these limitation values.

The particular combinations of elements and features in the above detailed embodiments are exemplary only. As those skilled in the art will recognize, variations, modifications, and other implementations of what is described herein can occur to those of ordinary skill in the art without departing from the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;
wherein said laser diode grid element comprises a heat sink, said heat sink being arranged in contact with said base plates, and wherein said at least two driving pins of each laser diode extend at least partially through said heat sink;
a means for combining said plurality of collimated laser beams into a predetermined output aperture; and
wherein said means for combining said plurality of laser beams is adapted for reflecting said collimated laser beams such that a distance between two adjacent collimated laser beams along the slow axis direction or along the fast axis direction, originating from the same laser diode grid element, in a plane defined by said predetermined output aperture, is smaller than said distance in a plane defined by said respective substantially flat surface.

2. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;
wherein said laser diode grid element comprises a heat sink, said heat sink being arranged in contact with said base plates, and wherein said at least two driving pins of each laser diode extend at least partially through said heat sink; and
wherein said heat sink comprises a liquid cooling heat exchanger comprising channels for liquid cooling, and wherein said channels and said driving pins of said laser diodes are offset between each other.

3. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;

wherein said laser diode grid element comprises a heat sink, said heat sink being arranged in contact with said base plates, and wherein said at least two driving pins of each laser diode extend at least partially through said heat sink;

wherein said driving pins are electrically connected to a printed circuit board provided at a side of said heat sink opposed to the laser diode side; and a thermally conducting means in between said printed circuit board and said heat sink adapted for guiding heat from said printed circuit board to said heat sink.

4. A laser diode grid element according to claim 3, wherein said driving pins are connected to said printed circuit board by means of an extension connector, said extension connector at least partially extending into said heat sink.

5. A laser diode grid element according to claim 1, wherein said collimation means comprises a plurality of lenses provided in a single molded array of lenses.

6. A laser diode grid element according to claim 1, further comprising a positioning plate and springs, said positioning plate and springs being adapted for keeping said laser diodes at predetermined locations on said substantially flat surface and being arranged in between said collimation means and said plurality of laser diodes.

7. A laser diode grid element according to claim 6, wherein mechanical references are provided on said substantially flat surface defining said predetermined locations.

8. A laser diode grid element according to claim 5, further comprising an alignment means for aligning said collimation means relative to said laser diodes on said substantially flat surface.

9. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;
wherein said laser diode grid element comprises a heat sink, said heat sink being arranged in contact with said base plates, and wherein said at least two driving pins of each laser diode extend at least partially through said heat sink; and
wherein said laser diodes are arranged according to a 2D grid structure on said substantially flat surface, said grid structure having a vertical inter-diode spacing and a horizontal inter-diode spacing orthogonal on said vertical inter-diode spacing; and wherein each of said laser diodes comprises a slow axis and a fast axis, wherein said laser diodes are oriented within said grid with their respective slow axis and fast axis aligned along a slow axis direction and a fast axis direction respectively, and wherein the size of the collimated light beams along said slow axis is substantially smaller than the inter-diode spacing along said slow axis direction.

10. A laser diode grid element according to claim 9, wherein said heat sink comprises a liquid cooling heat exchanger comprising channels for liquid cooling, wherein said channels and said driving pins of said laser diodes are offset between each other, and
wherein the orthogonal projections of said cooling channels on said substantially flat surface are extending in between said laser diodes along the fast axis direction.

11. A laser diode grid element according to claim 2, wherein said cooling channels have a variable width, said width being larger in the area with a higher local laser diode density than in an area with a lower local laser diode density.

12. A light emitting system, comprising at least one laser diode grid element according claim 1, further comprising a means for combining said plurality of collimated laser beams into a predetermined output aperture.

13. A light emitting system according to claim 1, wherein said means for combining said plurality of laser beams is adapted for reflecting said collimated laser beams such that the distance between two adjacent collimated laser beams along the slow axis direction, originating from the same laser diode grid element, in the plane defined by said predetermined output aperture, is smaller than said distance in the plane defined by said respective substantially flat surface.

14. A light emitting system according to claim 1, wherein said means for combining said plurality of laser beams is adapted for reflecting said collimated laser beams such that the distance between two adjacent collimated laser beams along the fast axis direction, originating from the same laser diode grid element, in the plane defined by said predetermined output aperture, is smaller than said distance in the plane defined by said respective substantially flat surface.

15. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;
wherein said laser diode grid element comprises a heat sink, said heat sink being arranged in contact with said base plates, and wherein said at least two driving pins of each laser diode extend at least partially through said heat sink;
a means for combining said plurality of collimated laser beams into a predetermined output aperture; and
at least two laser diode grid elements, wherein said means for combining said plurality of laser beams is adapted for reflecting said collimated laser beams such that projections on a plane defined by said predetermined output aperture for said collimated laser beams originating from different laser diode grid elements are interposed between each other.

16. A light emitting system according to claim 15, wherein said means for combining said plurality of laser beams is adapted for reflecting said collimated laser beams such that the distance between any pair of nearest collimated beams in a plane defined by said predetermined output aperture is smaller than the minimal inter-diode distance along the slow axis direction in a plane defined by said respective substantially flat surface for said respective laser diode grid elements.

17. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;
wherein said laser diode grid element comprises a heat sink, said heat sink being arranged in contact with said base plates, and wherein said at least two driving pins of each laser diode extend at least partially through said heat sink;
a means for combining said plurality of collimated laser beams into a predetermined output aperture; and
wherein said means for combining comprises an array of reflecting surfaces for reflecting the collimated laser beams through said predetermined output aperture.

18. A laser diode grid element, comprising
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package;
wherein said laser diode grid element comprises a heat sink, said heat sink being arranged in contact with said base plates, and wherein said at least two driving pins of each laser diode extend at least partially through said heat sink;
a means for combining said plurality of collimated laser beams into a predetermined output aperture;
at least two laser diode grid elements, wherein a laser diode grid element comprises
a plurality of laser diodes adapted for generating a corresponding plurality of laser beams and said plurality of laser diodes being arranged along a corresponding substantially flat surface;
a collimation means for each said laser diodes, adapted for generating a collimated light beam from a corresponding laser beam, said collimated light beams being substantially perpendicular on said respective substantially flat surface;
wherein said laser diodes are comprised in standard packages, said standard packages comprising a base plate serving as cooling surface of the laser diode, a metal housing arranged on said base plate to protect said laser diode, and at least two driving pins which extend from said laser diode through said base plate and which are used for driving said laser diode within said package; and
wherein said laser diode grid element comprises a heat sink, said heat sink being arranged in contact with said base plates, and wherein said at least two driving pins of each laser diode extend at least partially through said heat sink,
wherein the respective said substantially flat surfaces of a first and a second laser diode grid element are substantially parallel and facing each other.

19. A light emitting system according to claim 18, wherein the projections of the locations of the laser diodes of the first laser diode grid element and the second laser diode grid element onto a plane which is substantially parallel with said respective substantially flat surfaces, are interposed.

* * * * *